United States Patent
Davis

(10) Patent No.: US 11,644,492 B2
(45) Date of Patent: May 9, 2023

(54) ELECTRICITY METER THERMAL PERFORMANCE MONITORING

(71) Applicant: Landis+Gyr AG, Cham (CH)

(72) Inventor: Ian Jackson Davis, Peakhurst Heights (AU)

(73) Assignee: Landis+Gyr AG, Cham (CH)

( * ) Notice: Subject to any disclaimer, the term of this patent is extended or adjusted under 35 U.S.C. 154(b) by 0 days.

(21) Appl. No.: 17/273,367

(22) PCT Filed: Sep. 6, 2019

(86) PCT No.: PCT/EP2019/073811
§ 371 (c)(1),
(2) Date: Mar. 4, 2021

(87) PCT Pub. No.: WO2020/053085
PCT Pub. Date: Mar. 19, 2020

(65) Prior Publication Data
US 2021/0341520 A1 Nov. 4, 2021

(30) Foreign Application Priority Data

Sep. 14, 2018 (EP) .................................... 18194512

(51) Int. Cl.
*G01R 22/06* (2006.01)
*G01M 99/00* (2011.01)
*G01K 3/00* (2006.01)

(52) U.S. Cl.
CPC ........... *G01R 22/068* (2013.01); *G01K 3/005* (2013.01); *G01M 99/002* (2013.01)

(58) Field of Classification Search
CPC .... G01R 22/068; G01K 3/005; G01M 99/002
See application file for complete search history.

(56) References Cited

U.S. PATENT DOCUMENTS 6,847,300 B2   1/2005   Yee et al.
7,716,012 B2   5/2010   Bickel
(Continued)

FOREIGN PATENT DOCUMENTS

EP   1980862 A2    10/2008
WO   2013006901 A1  1/2013
WO   2016066373 A1  5/2016

OTHER PUBLICATIONS

International Search Report and Written Opinion, PCT Patent Application No. PCT/EP2019/073811, dated Dec. 4, 2019, 11 pages.

(Continued)

*Primary Examiner* — Christopher P McAndrew
*Assistant Examiner* — Zannatul Ferdous
(74) *Attorney, Agent, or Firm* — Kilpatrick Townsend & Stockton LLP

(57) ABSTRACT

A method of monitoring a functional state of an electricity meter, includes generating at least one temperature signal from which an actual temperature value of the electricity meter can be derived; determining whether the actual temperature value and/or a gradient thereof exceeds at least one threshold value derived from at least one predefined temperature curve representing predefined temperature values of the electricity meter over time according to a modelled thermal behaviour of the electricity meter. Further, a computer program, a computer-readable data carrier having stored thereon a computer program, a data carrier signal carrying a computer program, and an electricity meter configured to carry out the computer program are described. Finally, an electricity metering system, in particular an Advanced Metering Infrastructure, includes at least one electricity meter and/or at least one administration device (Continued)

configured to carry out a method of monitoring a functional state of an electricity meter.

17 Claims, 12 Drawing Sheets

(56) References Cited

U.S. PATENT DOCUMENTS

| | | | |
|---|---|---|---|
| 2003/0146758 A1* | 8/2003 | Koike | G01F 1/6965 |
| | | | 324/453 |
| 2008/0094231 A1 | 4/2008 | Hohn et al. | |
| 2011/0218688 A1* | 9/2011 | Lentner | H02J 1/14 |
| | | | 700/292 |
| 2013/0088799 A1 | 4/2013 | Zeller | |
| 2013/0261833 A1* | 10/2013 | Meghani | G06Q 10/10 |
| | | | 700/297 |
| 2014/0225737 A1 | 8/2014 | Brown et al. | |
| 2016/0091904 A1* | 3/2016 | Horesh | G05D 23/1904 |
| | | | 700/276 |
| 2017/0363441 A1* | 12/2017 | Carpenter | G01D 4/002 |
| 2018/0003572 A1* | 1/2018 | Garsd | G01K 13/00 |
| 2021/0055348 A1* | 2/2021 | Kim | G01R 31/367 |

OTHER PUBLICATIONS

Office Action, European Patent Application No. 18194512.2, dated Dec. 14, 2020, 6 pages.

* cited by examiner

ELECTRICITY METER THERMAL PERFORMANCE MONITORING

The present invention relates to a method of monitoring a functional state of an electricity meter. Further, the present invention relates to a computer program for monitoring a functional state of an electricity meter. Furthermore, the present invention relates to a computer-readable data carrier having stored thereon a computer program according to the present invention, and to a data carrier signal carrying a computer program according to the present invention. Moreover, the present invention relates to an electricity meter configured to carry out the computer program according to the present invention. Finally, the present invention relates to an electricity metering system, in particular an Advanced Metering Infrastructure (AMI), comprising at least one electricity meter according to the present invention.

TECHNOLOGICAL BACKGROUND

Methods for monitoring functional states of electricity meters are known from the prior art. Such methods are commonly used for monitoring, whether an electricity meter is functioning properly. In particular, faulty conditions of electricity meters should be identified in order to prevent hazardous events. Faulty conditions may occur, e.g. by self-heating of the electricity meter due to overload or malfunction in micro-electronic circuits of the electricity meter, due to excessive current flow or malfunction in a main internal busbar and associated electrical terminals of the electricity meter, or due to environmental impacts on the electricity meter, such as excessive temperatures in the surroundings of the electricity meter, which may be caused by sunlight or other heat sources, such as pipes of heating systems, or alike.

WO 2013 006901 A1 on behalf of the applicant of the present invention describes a method and apparatus for monitoring the condition of a utility meter by obtaining a temperature value associated with the meter, determining whether the temperature value crosses a threshold, triggering an action if the threshold value is crossed. In another form the temperature can be used as a fault parameter to determine the condition of a utility meter.

WO 2016 066373 A1 on behalf of the applicant of the present invention relates to a method of determining a reduction of remaining service lifetime of an electrical device during a specific time period. A measurement system is provided comprising a temperature measurement device, a current measurement device and a voltage measurement device. A temperature value, voltage values and current values are measured by using the measurement device. A harmonic load is determined based on the current values. A reduced maximum operating temperature is determined based on the harmonic load. An amount of transient over-voltages is determined based on the voltage values. A transient aging factor is determined based on the amount of transient over-voltages. A temperature dependent aging factor is determined based on the temperature value and the reduced maximum operating temperature. Finally, the reduction of remaining service life is determined based on the specific time period, the transient aging factor and the temperature dependent aging factor.

Furthermore, U.S. Pat. No. 6,847,300 B2 describes an electric power meter including a temperature sensor and a controller. The controller is operable, based on the temperature reported from the temperature sensor, to generate alarm(s) when the temperature exceeds certain alarm threshold(s), and to activate a power disconnect switch, thereby shutting off power to customer premises, when the temperature exceeds a shut off threshold. The controller is operable to activate the power disconnect switch for non-payment of electricity cost, subject to secondary criteria based on regulatory requirements. A customer terminal may be used to notify a customer of an alarm condition, to provide information regarding electrical power usage or to provide information regarding disconnection of electrical power.

EP 1 980 862 A2 describes a meter having an interface that is connected to a temperature sensor, i.e. temperature-dependent resistor, by a wireless transmission circuit. A processor includes a saving unit for saving temperature data into a memory at pre-set time intervals or based on events registered in the processor, where the temperature data are provided with time information. The processor produces an alarm signal, which is applied to an interface or an interface contact, if a maximum temperature value is exceeded.

U.S. Pat. No. 7,716,012 B2 deals with a process monitoring method that aggregates monitoring devices and optionally sensors into one or more groups that are each related to a process of a utility system. The monitoring devices are organised into a monitoring system hierarchy manually or automatically. A process algorithm determines from the hierarchy which monitoring devices are connected to a load. Monitored data from load-connected monitoring device pairs are correlated to produce a correlation coefficient that is compared against a correlation threshold selected between 0 and 1. When the correlation coefficient exceeds the threshold, the device pair is grouped into a process group. Other device pairs exceeding the threshold are likewise grouped into the process group. Multiple processes may be determined with the process algorithm. Sensors may also be grouped manually with the process group containing monitoring devices, which may include virtual monitoring devices. Alarms associated with monitoring devices and sensors are aggregated into one process alarm.

Methods for monitoring functional states of electricity meters according to the prior art have the disadvantage that they rely on the assessment of temperature differences and gradients with respect to certain pre-defined thresholds. This renders known methods as well as devices and systems implementing such methods rather inflexible.

DESCRIPTION OF THE INVENTION

An object of the present invention is to solve or at least mitigate disadvantages of methods for monitoring functional states of electricity meters according to the prior art. In particular, it is an object of the present invention to provide a method for monitoring functional states of electricity meters as well as respective devices and systems therefore, which may be easily adapted to respective operating conditions.

This object is achieved by method, computer program, computer-readable data carrier, data carrier signal, electricity meter, and electricity metering system according to independent claims 1, 12, 13, 14, 15, and 16, respectively.

In particular, according to the present invention, the object is achieved by a method of monitoring a functional state of an electricity meter, in that the method comprises the steps of:

generating at least one temperature signal from which an actual temperature value of the electricity meter can be derived;

determining whether the actual temperature value and/or a gradient thereof exceeds at least one threshold value derived from at least one predefined temperature curve representing predefined temperature values of the electricity meter over time according to a modelled thermal behaviour of the electricity meter.

With a computer program for monitoring a functional state of an electricity meter, the object is achieved in that the computer program comprises instructions which, when the computer program is executed by an electricity meter and/or an administration device in an electricity metering system, cause the electricity meter and/or the administration device to carry out the steps of a method according to the present invention.

A computer-readable data carrier according to the present invention has stored thereon a computer program according to the present invention.

A data carrier signal according to the present invention is carrying a computer program according to the present invention.

An electricity meter according to the present invention achieves the object in that the electricity meter is configured to carry out a method according to the present invention.

The object is achieved by an electricity metering system, in particular an AMI, in that the metering system comprising at least one electricity meter according to the present invention and/or at least one administration device configured to carry out a method according to the present invention.

These solutions according to the present invention have the advantage over monitoring technologies known from the prior art that not only temperature differences and gradients with respect to certain pre-defined thresholds are monitored, but an additional dimension is added to the monitoring process in that temporal effects of temperatures relating to operational states and conditions of electricity meters are considered. In other words, according to the present invention, a dynamic behaviour of temperature values and/or temperature gradients is monitored as they are based on temperatures curves as functions of time in correspondence with a respective thermal behaviour of a certain type of electricity meter, rather than merely monitoring whether temperatures values or temperature gradients exceed certain nominal values according to the prior art. Thereby, the present invention allows for early detection of overheating in an electricity meters, and potentially other electronic devices, due to fault conditions.

By using at least one temperature curve according to the present invention, a change of the respective temperature value can be monitored over time according to an individual performance of an electricity meter as it may change over time, instead of assuming general or common performance parameters of electricity meters as done according to the prior art. The present invention allows for considering certain timespans of the course of temperature values and/or temperature gradients to be monitored, and thus allows to adapt the threshold values according to certain events, load conditions, operational conditions, and/or environmental conditions of the electricity meter within these time spans.

Thereby, on the one hand, the solutions according to the present invention enable to increase accuracy of the monitoring in that the dynamic consideration of predefined temperature curves allows for setting tighter thresholds for temperature values and/or gradients than possible with static thresholds as used according to the prior art. On the other hand, the solutions according to the present invention enable to increase accuracy of the monitoring in that the thermal behaviour itself and thus the at least one predefined temperature curve may be readjusted over time, thereby providing moving or rolling thresholds or limits for respective temperature values and/or temperature gradients in a manner like moving means or averages are applied to time series of data points. Thus, flexibility and adaptability of the monitoring process are enhanced.

The solutions are not limited to monitoring electricity meters themselves but are also directed to a detection of faulty electrical lines or cabling connected to electricity meters. Such conditions can occur, when fixing elements, such as screws, in electrical terminals to which the electrical lines are attached, are overtightened, not tightened well enough, or an insulation of the electrical lines is not removed properly. In case of overtightening, the electrical lines may be damaged e.g. such that their diameter is significantly reduced, and/or their strands are disrupted. In case of not well enough tightened or stripped electrical lines, the contact area between the line and the terminal can be significantly reduced. Both cases may result in high resistance contacts, which can cause an overheating that can be detected by solutions according to the present invention.

The solutions according to the present invention can be combined as desired and further improved by the following embodiments that are advantageous on their own in each case. Unless specified to the contrary, the embodiments can be readily combined with each other. A skilled person will easily understand that all apparatus features of devices and systems according to the present invention may as well be implemented as and/or constitute steps of a method and/or computer program according to the present invention and vice versa.

In a possible embodiment of method according to the present invention, the method further comprises the step of generating a trigger signal if the actual temperature value and/or a gradient thereof exceeds the at least one threshold value. The trigger signal may be used to influence the operational state or operational conditions of the electricity meter, and may be further used to signalise a faulty state of the electricity meter, e.g. by creating an error signal.

For example, the operational state may be influenced by switching off an electrical load applied to the electricity meter, in order to reduce heat generation within and/or around the electricity meter. An operational condition of electricity meter may be influenced for example by providing an interior and/or exterior heat sink for the electricity meter, e.g. in the form of a cooling fan, in order to lower an actual temperature within and/or around the electricity meter to a desired value. Respective signals representing the change in the operational state and/or operational condition, as well as error signals may be logged within the electricity meter and/or send to a higher instance administration device, such as a data concentrator or Head-End System (HES) of an electricity metering system, in order to be processed and made available for data analysis and decision-making, Alternatively, or additionally, the electricity meter may send or receive information to or from a higher instance device, respectively, such as instructions for changing the operational state or operational conditions, the adjustment of temperature curves and/or threshold values, or alike. This helps in further improving flexibility and accuracy of monitoring functional states of electricity meters.

Moreover, a derivation and/or adaptation of threshold values for triggering signals according to the present invention helps in improving reaction time in solutions for monitoring functional states of electricity meters in comparison to the prior art. According to the prior art, thresholds are set such that they allow for detecting a worst-case thermal perform for a normally functioning meter, and hence, triggering signals will not be generated until a worst case normal condition is exceeded. In contrast to that, according to the present invention, varying thresholds are being continually computed for any given instant in time, Thus, the present invention allows for detecting a fault condition sooner as the prior art, when a measured performance of the electricity meter exceeds an expected performance for a given set of operational parameters of the electricity meter.

In a possible embodiment of a method according to the present invention, the method further comprises the step of adjusting the at least one temperature curve and/or to select the temperature curve from a set of predefined temperature curves according to a certain operational state and/or according to a certain operational condition of the electricity meter. Adjustment of the at least one temperature curve may involve calculating intermediate values between two adjacent predefined temperature curves. Different operational states may include various modes of operating the electricity meter, for example whether the electricity meter is in an idle mode, a standby mode, a standard mode, a data receiving and/or sending mode, a data processing mode, a firmware update mode, or alike. Different operational conditions may also include different environmental conditions of electricity meter, in particular an ambient temperature, airflow, and/or thermal radiation in the surroundings of the electricity meter.

Operational states may further be distinguished from faulty states of the electricity meter, such as when an error in hardware and/or software of the electricity meter occurs. In distinguishing the operational states from the faulty states, the functional state of the electricity meter may be assessed. By adjusting the at least one temperature curve and/or selecting the temperature curve from a set of predefined temperature curves, the determination of whether a threshold value is exceeded, can be based on a specific temperature curve representing a respective operational state and/or respective operational conditions. Threshold values for determining, whether the electricity meter has entered a faulty state can be adjusted accordingly. This helps in further improving accuracy and reliability of the monitoring of functional states of the electricity meter.

In a possible embodiment of a method according to the present invention, the method further comprises the step of identifying at least one point of interest in the at least one temperature curve. Points of interest may relate to certain operational conditions of the electricity meter, such as a steady state, load changes, heating or cooling conditions and large variations in thermal energy generation. In defining the points of interest, specific thermal behaviours of the electricity meter may be closely monitored, such as by an increased density of predefined temperature values of the at least one predefined temperature curve and/or an increased rate of sampling temperature signals, which helps to better define and detect certain thermal phenomena in a differentiated manner. Thereby, accuracy and reliability of the monitoring of the functional state of the electricity meter can be further improved.

In a possible embodiment of a method according to the present invention, an electrical resistance in a primary current path within the meter is associated to the at least one predefined temperature curve and/or derived from the actual temperature value and/or gradient thereof. The primary current path may comprise a bus bar a shunt, a switch or alike. The electrical resistance in the primary current path determines heat generation along the primary current path according to a respective electrical load on the primary current path. Hence, in associating the at least one predefined temperature curve to an electrical resistance in the primary current path, the at least one predefined temperature curve may become a function of the electrical load on the primary current path under the respective electrical resistance. The actual temperature value and/or gradient thereof can be used to determine the electrical resistance of the primary current path. Thereby, critical electrical resistances of the primary current path may be identified. This helps in further improving accuracy and reliability of the monitoring of functional states of electricity meters, since temperature abnormalities in high current mains connected devices, such as overheating, may be a first indicator of a fault that could lead to fire or device disintegration.

In a possible embodiment of a method according to the present invention, the method further comprises the step of establishing at least one thermal model for modelling the thermal behaviour of the electricity meter, the at least one thermal model comprising the at least one predefined temperature curve. Such a thermal model may be implemented in any kind of computer software, such as a firmware of an electricity meter and/or an operating software of an administration device in an electricity metering system. The thermal model is used to model thermal behaviour of the electricity meter or any other electrical device and may comprise one or more thermally active elements or components of the electricity meter, the thermal behaviour of which is modelled in order to estimate power dissipation and therefore the amount of heating due to both micro-electronic circuits and heating due to current flow in main current paths. Machine learning may then be applied to the output of the model to tune configuration parameters of the thermal model in order to adapt the thermal model to certain operation conditions and operational states of the electricity meter.

For example, input parameters of the thermal model comprise the following:
heating due to heat generation in micro-electronic circuits;
heating based on current flow and resistance in a primary current path
heating due to ambient environment, e.g. other heat generating installations or devices in the vicinity of the electricity meter, or direct sunlight shining onto the electricity meter;
currently measured absolute actual temperature or temperature gradient; and/or
estimated (or measured) external ambient temperature.

For example, output parameters of the thermal model comprise the following:
predefined Temperatures, temperature gradients and/or temperature curves; and/or
time spans until the electricity meter or thermally active elements or components thereof reach points of interest in the temperature curves, such as certain thermal states, e.g. steady states or alike.

Such outputs of the thermal model are preferably continuously calculated, for example every tenth of a second, every second and/or every minute. Due to variability in estimated input parameters, the thermal model may be calculated multiple times with different possible minimum and maximum values to determine a range of possible output parameters. The output parameters may be used to perform certain actions in the course of determining whether the actual temperature value and/or a gradient thereof exceeds at least one threshold value.

For example, based on a comparison between a measured or estimated actual temperature gradient and a predefined temperature gradient, it may be determined whether:

the electricity meter or an element or component thereof has a fault;

model parameters of thermally active elements or components require adjustment;

a measured or estimated external ambient temperature require adjustment; and/or a temperature sensor requires adjustment.

For example, based on a comparison between a measured or estimated actual temperature value and a predefined temperature value, it may be determined whether:

the electricity meter or an element or component thereof has a fault;

model parameters of thermally active elements or components require adjustment;

a measured or estimated external ambient temperature requires adjustment; and/or a temperature sensor requires adjustment.

For example, when the electricity meter is in a steady state with a low load condition, it may be determined whether:

model parameters of thermally active elements or components require adjustment;

a measured or estimated external ambient temperature requires adjustment; and/or a temperature sensor requires adjustment.

Any deviations or differences between actual values and predefined values, i.e. between model output parameters and measured and/or estimated values of the respective parameters may indicate a modelling error and/or a faulty condition of the electricity meter, and are tracked over time, preferably long term, to determine based on further processing of the parameters, if any kind of trend, pattern or correlation hinting to a specific modelling, software and/or hardware error, can be identified.

In a possible embodiment of a method according to the present invention, upon identification of certain errors, trends, patterns or correlations between the actual temperature value and/or the gradient thereof, and the at least one predefined temperature curve, at least one parameter of the thermal model is automatically adjusted by machine learning.

Preferably, in the course of identification, errors due to faulty conditions are distinguished from incorrectly set configuration parameters or external effects and operating conditions, such as heating from sources outside of the electricity meter. For example, a logic implemented for identifying and distinguishing certain errors, trends, patterns or correlations from each other in a machine learning process to be carried out as a part of a method according to the present invention, may be based on the following:

considering certain astronomical and seasonal effects corresponding to a certain time of day and time of year, respectively;

determining if there is a low load condition;

comparing parameters and values to respective historical parameters and values, in particular transient thermal responses of the electricity meter;

determining if operating states relating to a primary current path have changed, in particular due to changes in a metered electrical load;

determining if operating states relating to microelectronic circuits have changed; and/or determining if a cooling-off effect is at hand, e.g. due to a drop of electrical load metered and/or applied to microelectronic circuits.

When the process of identifying and distinguishing certain errors, trends, patterns or correlations from each other determination is successful, the machine learning process will involve adjustment and/or change of parameters of the model in such a way that the respective error or an unwanted trend is reduced.

Whenever a machine learning process is applied, it should be avoided that a respective system carrying out the machine learning process draws false conclusions, i.e. accepts a faulty state or condition as a new norm or reference. False conclusions can be avoided by placing range limits on model configuration parameters. If in the machine learning process, it is attempted to modify a particular configuration parameter beyond its limits, then an exceptional condition is indicated, and/or an alarm condition is raised. Thereby, a machine learning monitoring logic is implemented, which runs in parallel to the primary logic that triggers warnings when the model output errors exceed certain thresholds.

In a possible embodiment of a method according to the present invention, the step of establishing the at least one thermal model includes the step of defining at least one equilibrium state which the electricity meter assumes during operation, the at least one equilibrium state representing a thermal equilibrium of the electricity meter in dependence of at least one electrical load running through the electricity meter, and of environmental conditions existing in an environment of the electricity meter. The at least one equilibrium state may be based on a certain operational state of the electricity meter, e. g. an electrical power condition of the electricity meter based on a certain current flowing through the electricity meter at a certain phase and voltage. Environmental conditions may in particular refer to a temperature in the surroundings of the electricity meter and/or to thermal radiation to which the electricity meter is exposed or which is emitted from the electricity meter. The at least one temperature curve can then be adjusted according to the at least one equilibrium state. In particular, an equilibrium temperature corresponding to the at least one equilibrium state may be identified and/or defined. Threshold values to be monitored may then be defined based on the respective equilibrium temperature. This helps in further adapting the threshold values to respective operational conditions of the electricity meter, and thus to improve flexibility and accuracy of the monitoring of the functional state of the electricity meter.

In a possible embodiment of a method according to the present invention, the step of establishing the at least one thermal model includes the step of defining at least one heating behaviour and/or at least one cooling behaviour of the electricity meter based on at least one step response of the electricity meter to a change in an operational and/or functional state of the electricity meter. Step responses particularly occur when operational conditions of the electricity meter suddenly change, such as when electrical power applied to the electricity meter suddenly rises or falls, either when the electrical load to be measured by the electricity meter changes, or when electronic circuitry of the electricity meter itself performs certain operations, including power on or power off. Accordingly, the at least one heating behaviour commonly relates to a rise in electrical power, whereas the at least one cooling behaviour relates to a drop of electrical power applied to the electricity meter. In considering these behaviours, respective thresholds values to be monitored can be adjusted, which helps in further improving flexibility and accuracy of the monitoring of the functional state of the electricity meter.

For example, the at least one functional step response relates to a change of an electrical load on a bus bar of the electricity meter. The bus bar or collecting bar of the electricity meter carries the electrical power to be metered and is thus exposed to relatively high maximal currents and voltages. Consequently, the bus bar is a critical component to be monitored, since due to the relatively high loads, failures on the busbar and related terminals can cause hazardous conditions, including overheating, melting, arcing or alike, of respective components, which on the one hand may cause power failures, and on the other hand can ignite fires. Thus, involving changes of the electrical loads on the bus bar in the temperature model helps to further improve accuracy and reliability of the monitoring of the functional state of the electricity meter.

In a possible embodiment of a method according to the present invention, the step of establishing the thermal model involves the step of determining at least one thermal resistance value and/or the step of determining at least one thermal capacitance value of the electricity meter. The at least one thermal resistance value serves for defining temperature differences across the structure of the electricity meter, and to model the thermal behaviour, e.g. a heat sink behaviour, of the electricity meter and its ability to conduct thermal energy as a reaction to being exposed to thermal energy which may be generated on the inside of the electricity meter or in the surroundings thereof. The at least one thermal capacitance value helps to define a thermal mass of the electricity meter, and to model the thermal behaviour thereof, in particular its ability to store thermal energy. The at least one thermal resistance value and/or the at least one thermal capacitance value may be applied to each thermally active element or component of the electricity meter as a respective modelling parameter of the thermal model to be established. Thereby, the at least one thermal resistance value and at least one thermal capacitance value help to refine the thermal model of the electricity meter to provide a precise understanding of the thermal behaviour of the electricity meter and thus generate the at least one predefined temperature curve. Consequently, the at least one thermal resistance value and at least one thermal capacitance value help to further improve accuracy and reliability of the monitoring of functional states of the electricity meter.

In a possible embodiment of a method according to the present invention, the step of establishing at least one thermal model is carried out for at least two different types of operating conditions of the electricity meter and/or at least two different types of electricity meters. The at least two different types of operating conditions may relate to different load conditions and operational states of the electricity meter and/or to different functional states of the electricity meter. In the different load conditions, different electrical loads on the electricity meter may be considered. As mentioned above, different operational states may include various modes of operating the electricity meter, for example an idle mode, a standby mode, a standard mode, a data receiving and/or sending mode, a data processing mode, a firmware update mode, or alike, and may further include different environmental conditions of electricity meter, in particular temperature, airflow, and/or thermal radiation in the surroundings of the electricity meter. Operational states are to be distinguished from faulty states of the electricity meter, such as when an error in hardware and/or software of the electricity meter occurs. This helps in further improving accuracy and reliability of the monitoring of functional states of the electricity meter.

Furthermore, establishing at least one thermal model for at least two different types of electricity meters may involve establishing a general thermal model for the at least two different types of electricity meters. Alternatively, or additionally, an individual thermal model may be established for each one of the at least two different types of electricity meters. Thereby, common and individual behaviours of electricity meters may be considered when establishing thermal models. On the one hand, this helps in improving accuracy and reliability of the monitoring of functional states of the electricity meter. On the other hand, efficiency in establishing thermal models may be improved.

Based on the at least one thermal model being established for at least two different types of operating conditions of the electricity meter and/or at least two different types of electricity meters, a set of predefined temperature curves may be generated, comprising temperature curves for respective different operating conditions and/or different electricity meters. Each of the predefined temperature curves of the set of predefined temperature curves may represent a specific thermal behaviour of an electricity meter or of different electricity meters under respective operating conditions. Hence, by selecting a predefined temperature curve from the set of predefined to curves, the monitoring of the functional state of the electricity meter may be easily adapted to respective operational conditions as or different types of electricity meters. This helps in further improving flexibility and accuracy of the monitoring of functional states of electricity meters.

BRIEF DESCRIPTION OF THE ACCOMPANYING DRAWINGS

The invention will be described hereinafter in more detail and in an exemplary manner using advantageous embodiments and with reference to the drawings. The described embodiments are only possible configurations in which, however, individual features as described above can be provided independently of one another or can be omitted.

Figure 11:
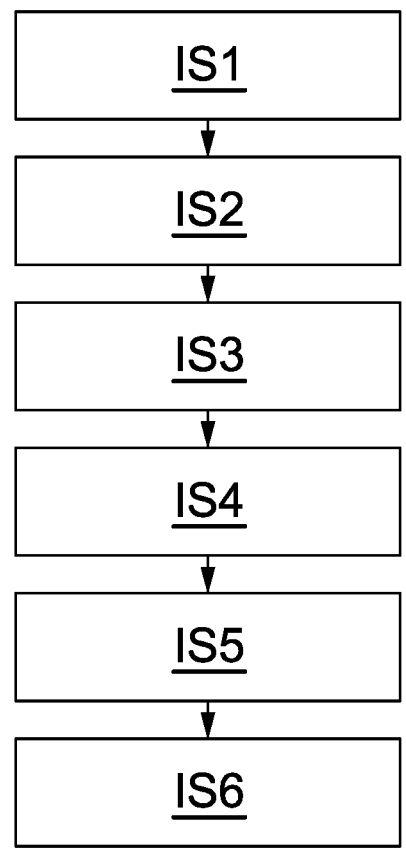
Figure 12:
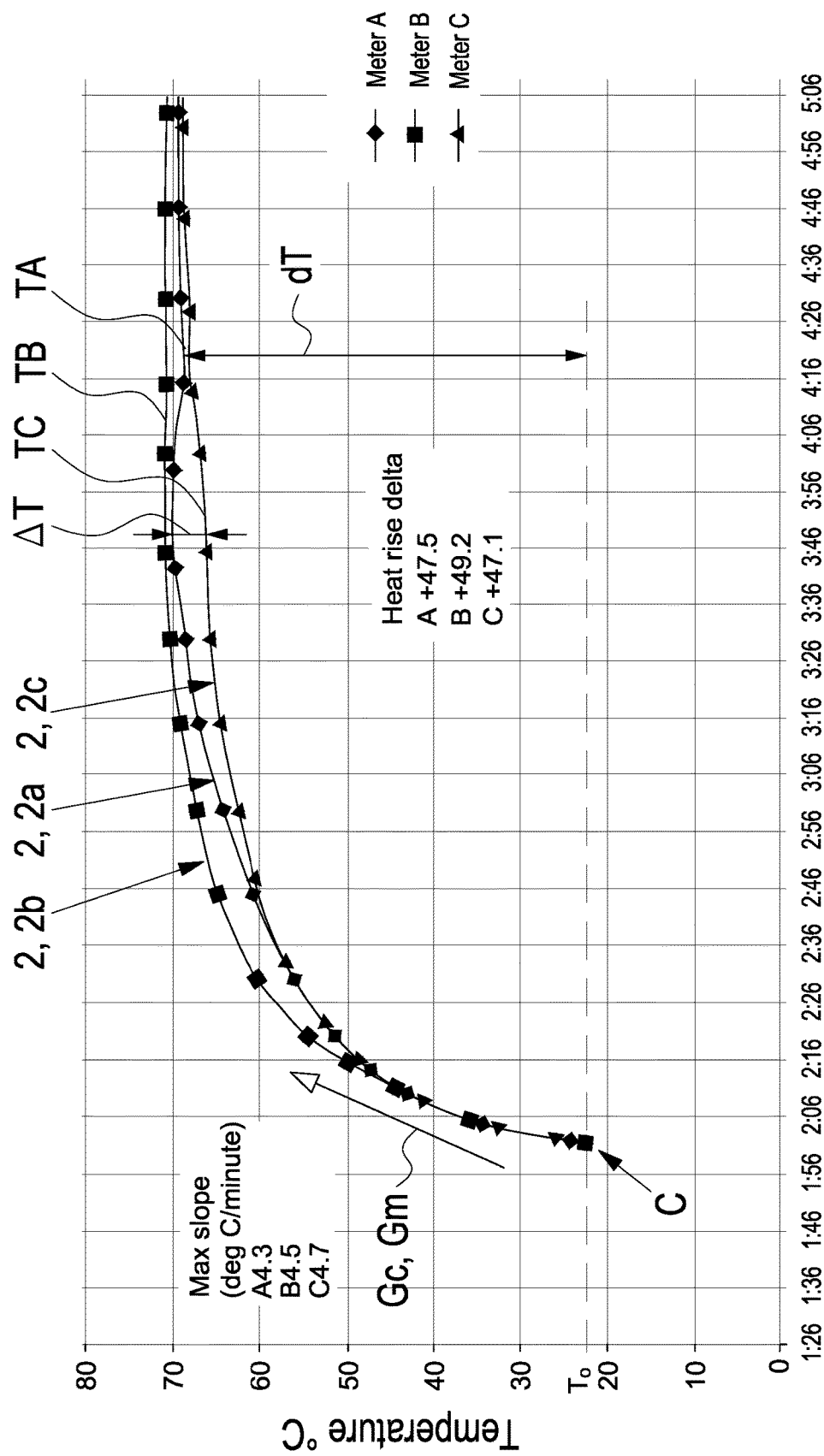

FIG. 11 shows an exemplary flowchart illustrating steps of an installation time course thermal model discovery procedure when establishing a thermal model according to the present invention for modelling a thermal behaviour of an electricity meter; and FIG. 12 shows an exemplary diagram illustrating actual temperature curves of three different electricity meters to be emulated with a thermal model according to the present invention.

WAYS OF EXECUTING THE INVENTION

Figure 1:
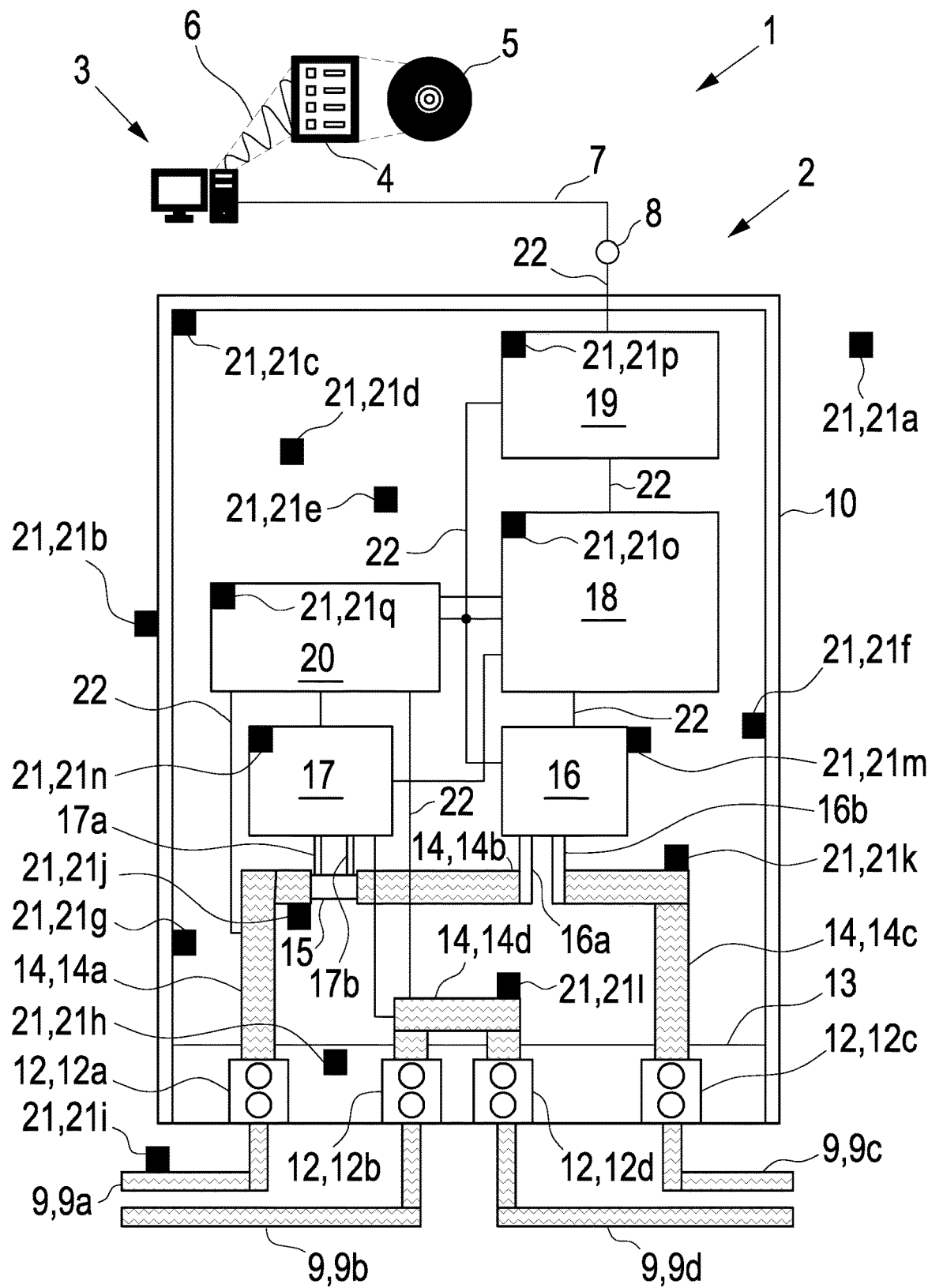
FIG. 1 shows a schematic diagram illustrating an exemplary schematic architectural illustration of an electricity metering system comprising an electricity meter according to an embodiment of the present invention, the electricity meter being illustrated in a schematic front view.

FIG. 1 shows a schematic diagram illustrating an exemplary schematic architectural front view of an electricity metering system 1 comprising an electricity meter 2 according to an embodiment of the present invention. The electricity metering system 1 further comprises an administration device 3, such as a data concentrator or Head-End system (HES) in the form of a computer, or alike, for administrating and controlling the electricity metering system 1. Control and administration of the electricity metering system 1, in particular of the electricity meter 2 and the administration device 3, is performed with the help of a computer program 4.

The computer program 4 can be provided on a computer-readable data carrier 5 configured to be accessed by the electricity meter 2 and/or the administration device 3, Alternatively, or additionally, the computer program 4 can be provided as being carried on a data carrier signal 6. The data carrier signal 6 or any other kind of data and/or information, can be exchanged between the electricity meter 2 and the administration device 3 via energy and/or information transmission lines 7. The energy and/or information transmission lines 7 may be established in a wired and/or wireless manner. For receiving and sending data and information via the energy and/or information transmission line 7, the electricity meter 1 is provided with a transmission means 8, in the form of a wired or wireless communication line, antenna, or alike. Furthermore, the electricity metering system 1 comprises electrical lines 9 in the form of cables or wires for transmitting electrical power to be metered by the electricity meter 2.

The electricity meter 2 comprises an enclosure 10, in the form of a housing, case, shell or alike, for housing in various components of the electricity meter 1. At a bottom section 11 of the enclosure 10, the electricity meter 2 is provided with electrical terminals 12 for connecting the electrical lines 9 to the electricity meter 2 in an electrically conductive manner. In particular, an active input terminal 12a is configured to be connected to a phase input line 9a, a neutral input terminal 12b is configured to be connected to a neutral input line 9b, an active output terminal 12c is configured to be connected to a phase output line 9c, and a neutral output terminal 12d is configured to be connected to a neutral output line 9d. The terminals 12 are mounted on a terminal block 13 of the electricity meter 2. The terminal block 13 is held by the enclosure 10 and is formed of a highly insulating material and supports the terminals 12.

A bus bar 14 with high current carrying capacity and low electrical resistance is provided within the electricity meter 2 as a primary current path for conducting electrical loads from the input terminals 12a, 12b to the output terminals 12c, 12d. The bus bar 14 has an active input section 14a, an active linking section 14b, an active output section 14c, and a neutral linking section 14d. The active input section 14a connects the active input terminal 12a to a resistive shunt 15. The active linking section 14b connects the resistive shunt 15 to a supply disconnect switch 16, in particular a switch input line 16a thereof.

The active output section 14c connects the supply disconnect switch 16, in particular a switch output line 16b thereof, to the active output terminal 12c. The neutral linking section 14d connects the neutral input terminal 12b to the neutral output terminal 12d.

A metering unit 17 of the electricity meter 2 comprising metering means in the form of microelectronics is connected to the busbar 14 in the region of the resistive shunt 15 used for measuring current flow through the busbar 14 by converting current to a proportional voltage. In particular, a metering input line 17a of the metering means 17 is connected to the resistive shunt 15 close to where the active input section 14a is connected to the resistive shunt 15. A metering output line 17b is connected to the resistive shunt 15 close to where the active linking section 14b is connected to the resistive shunt 15.

A processing unit 18 of the electricity meter 2 comprises at least one microelectronic primary processor, memory, oscillator and/or supporting circuitry. A communications unit 19 comprises communications microelectronics, such as at least one transceiver or radio transmitter for communication via the transmission means 8. A power supply unit 20 of the electricity meter 2 comprises a power supply circuitry and microelectronics for converting grid supply voltage to voltages suitable for operating internal meter circuitry and components, such as the supply disconnect switch 16, the metering means 17, the processing unit 18, and the communications unit 19.

Temperature sensors 21 are provided for generating temperature signals and/or temperature values. The temperature sensors 21 comprise a remote sensor 21a, external sensor 21b, internal top sensor 21c, internal front sensor 21d, internal back sensor 21e, internal side sensor 21f, terminal region sensor 21g, terminal block sensor 21h, supply line sensor 21i, input section sensor 21j, output section sensor 21k, linking section sensor I, switch sensor 21m, metering unit sensor 21n, processing unit sensor 21o, communications unit sensor 21p, and/or power supply unit sensor 21q.

The remote sensor 21a is arranged and configured to measure an ambient temperature in the surroundings of the electricity meter 2 and is therefore preferably not physically connected to the electricity meter 2 in order to avoid a conductive thermal energy transfer between the remote sensor 21a and the electricity meter 2. The external sensor 21b is arranged and configured to measure an external temperature of the electricity meter 2, in particular of the enclosure 10, The internal sensors 21c to 21f are arranged and configured to measure internal temperatures of the electricity meter 2 at a top wall, a front wall, a back wall, and a side wall, respectively (see FIG. 3), on the inside of the enclosure 10. The terminal region sensor 21g is arranged and configured to measure a temperature in the region near or around the electrical terminals 12 on the inside of the enclosure 10. The supply line sensor 21i is arranged and configured to measure a temperature of the electrical lines 9, in particular of the phase input line 9a. The terminal block sensor 21h is arranged and configured to measure a temperature of the terminal block 13. The input section sensor 21j, output section sensor 21k, and linking section sensor 21l are arranged and configured to measure a temperature of the busbar 14, in particular of the active input section 14a, preferably in the vicinity of the resistive shunt 15, the active output section 14c, and the neutral linking section 14d, respectively. The switch sensor 21m, the metering unit sensor 21n, the processing unit sensor 21o, the communications unit sensor 21p, and the supply unit sensor 21q are arranged and configured to measure a temperature of the supply disconnect switch 16, the metering unit 17, the processing unit 18, the communications unit 19, and the power supply unit 20, respectively.

Furthermore, internal conductors 22 of the electricity meter are provided in the form of cables, wires, conducting paths, conductor tracks, strip conductors, or alike, in order to connect the transmission means 8, bus bar 14, in particular the active input section 14a and the neutral linking section 14d thereof, the supply disconnect switch 16, the metering unit 17, the processing unit 18, the communications unit 19, the power supply unit 20, and/or the temperature sensors 21 to each other, whenever and exchange of information and/or energy between these components and elements of the electricity meter 2 is required. For the sake of lucidity, an explicit illustration of internal conductors 22 connected to the temperature sensors 21 has been omitted in FIG. 1.

Figure 2:
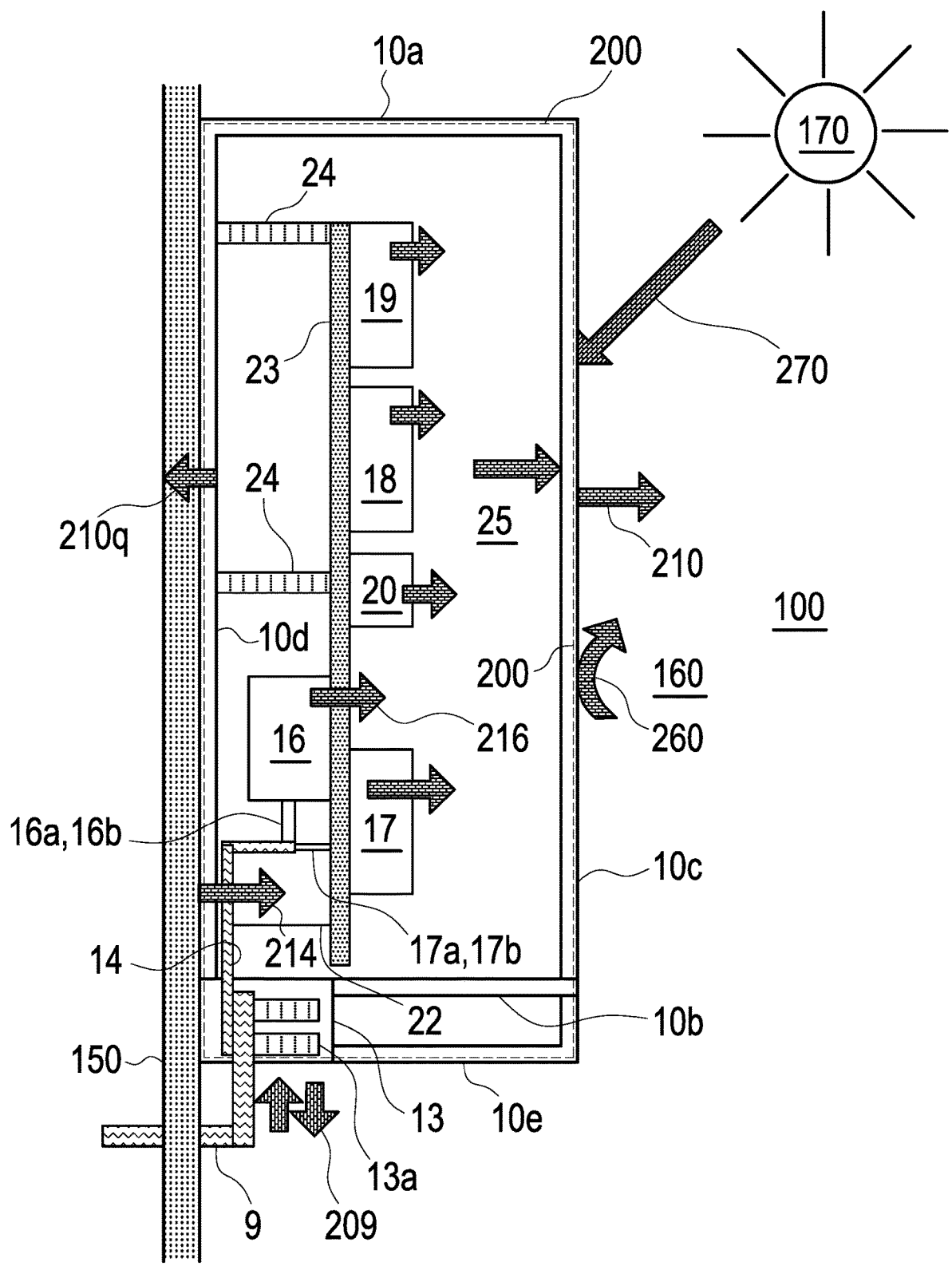
FIG. 2 shows a schematic cross-sectional side view of an electricity meter according to an embodiment of the present invention in an operating environment of the electricity meter.

FIG. 2 shows a schematic cross-sectional side view of the electricity meter 2 in an operating environment 100 of the electricity meter 2. Here it becomes apparent, that the enclosure 10 of the electricity meter 2 comprises a top wall section 10a, a bottom wall section 10b, a front wall section 10c, and a back wall section 10d. Furthermore, the enclosure 10 is provided or complemented with terminal cover 10e covering the electrical terminals 12. In the terminal block 13, the electrical terminals 12 are each provided with at least one fixing elements 13a, such as a terminal screw, clamp, latch, or alike for fixing the electrical lines 9 to the electrical terminals 12 while establishing in electrical contact between the electrical lines 9 and the busbar 14.

The supply disconnect switch 16, metering unit 17, processing unit 18, communications unit 19, and power supply unit 20 are mounted on a substrate 23, such as a printed circuit board (PCB). The substrate 23 is mounted to the enclosure 10, in particular the back wall section 10d thereof, by means of mounting elements 24. The mounting elements 24 may be embodied as mounting pegs, studs, spacer bolts, or alike.

The operating environment 100 typically comprises a mounting structure 150 such as a wall of e.g. a building structure an electric cabinet, or alike, an air mass 160, and external heat sources 170, such as the sun, piping, conducts, exhausts, or alike.

An envelope boundary 200 for defining a thermal balance of the electricity meter 2 with respect to the operating environment 100 is defined in order to establish a thermal model in line with a method according to the present invention. For example, the envelope boundary 200 extends along the walls of the enclosure 10, in particular runs within the top wall section 10a, the front wall section 10c, the back wall section 10d, and the terminal cover 10e which enclose an inner space 25 of the electricity meter 2.

With respect to the envelope boundary 200, certain thermal energy flows pertaining to the elements and components of the electricity meter 2 are defined for establishing a thermal model in line with a method according to the present invention. In the present example, the thermal energy flows in the form of negative or positive conduction, convection, and/or radiation heat transfers comprise a heat transfer 209 across the envelope boundary 200 via the electrical lines 9, a heat transfer 210 across the envelope boundary 200 from the enclosure 10 to the air mass 160 and the operating environment 100, a heat transfer 210d across the envelope boundary 200 from the back wall section 10d to the mounting structure 150, a heat transfer 214 within the envelope boundary 200 from the busbar 14 to the inner space 25 of the electricity meter 2, a heat transfer 216 within the envelope boundary 200 from the supply disconnect switch 16 to the inner space 25 of the electricity meter 2, a heat transfer 217 within the envelope boundary 200 from the metering unit to the inner space 25 of the electricity meter 2, a heat transfer 218 within the envelope boundary 200 from the processing unit 18 to the inner space 25 of the electricity meter 2, a heat transfer 219 within the envelope boundary 200 from the communications unit 19 to the inner space 25 of the electricity meter 2, a heat transfer 220 within the envelope boundary 200 from the power supply unit 20 to the inner space 25 of the electricity meter 2, a heat transfer 260 across the envelope boundary 200 due to convection of the air mass 160, and/or a heat transfer 270 across the envelope boundary 200 from the external heat source 170 to the electricity meter 2.

Figure 3:
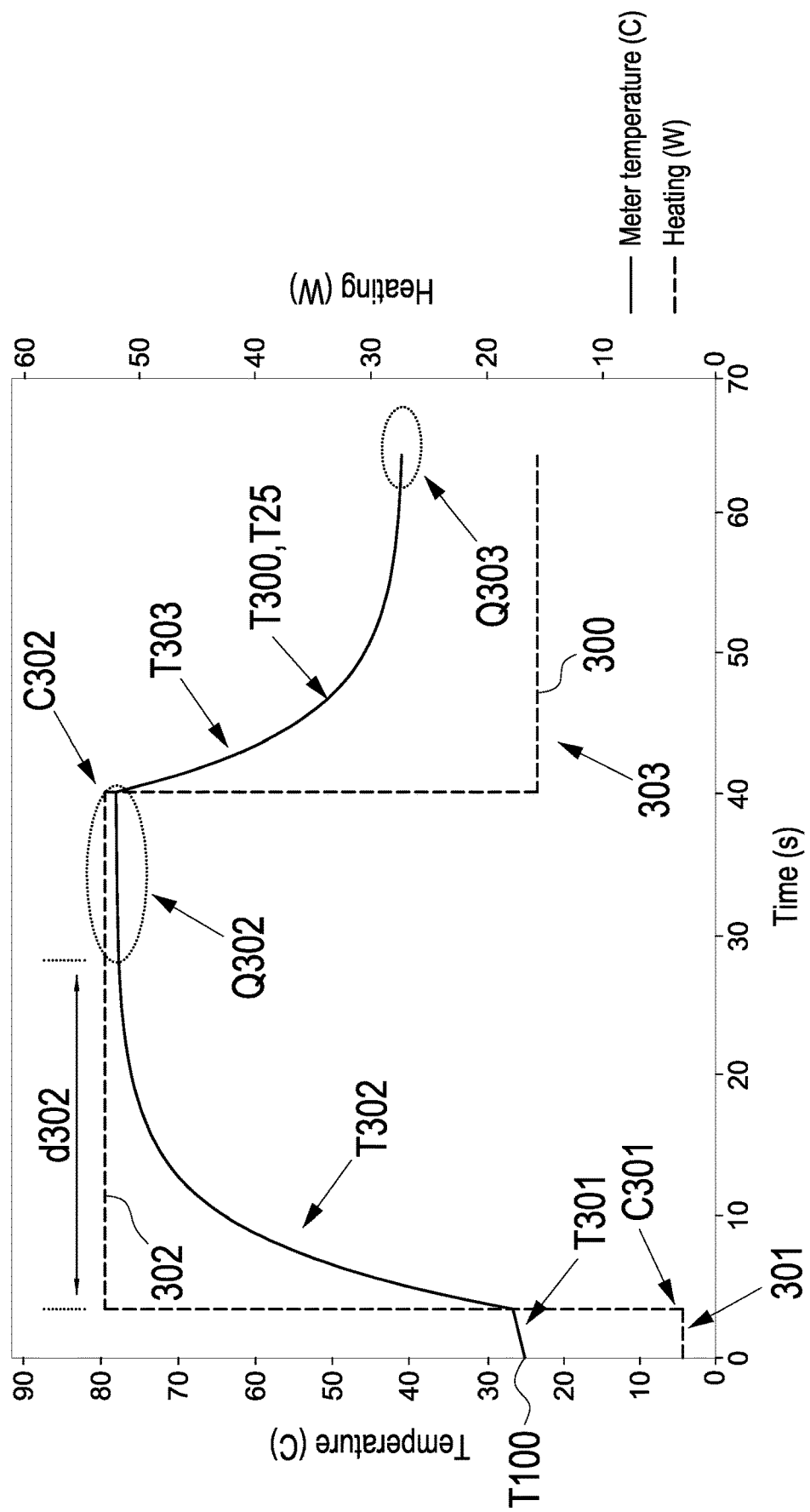
FIG. 3 shows an exemplary thermal performance plot of a thermal model according to the present invention for modelling a thermal behaviour of an electricity meter.

FIG. 3 shows an exemplary thermal performance plot 300 of a thermal model according to the present invention for modelling a thermal behaviour the electricity meter 2. Based on the thermal performance plot 300, a temperature curve T300, for example representing inner temperature T25 as a temperature of air within the inner space 25 of the electricity meter 2 is determined. In a first phase 301 of the thermal performance plot 300, heat transfers from internal microelectronic circuits of the electricity meter 2, which for example comprise heat transfers 216, 217, 218, 219, 220 pertaining to the supply disconnect switch 16, metering unit 17, processing unit 18, communications unit 19, and/or power supply unit 20, respectively, amounting to approx. 3 W, and lead to a slow temperature increase T301 starting from an external ambient temperature T100 representing the temperature of the operating environment 100.

At a first step change C301 in the thermal performance plot 300, a sudden rise in heat generation by the bus bar 14 sets in due to a current load of 100 A being applied to the bus bar 14 and associated parts and the primary current path of the electricity meter 2. Thus, in a second phase 302 of the thermal performance plot 300, a rapid temperature increase T302 takes place due to the respective heat transfer 214 of approx. 50 W in addition to the heat transfers 216, 217, 218, 219, 220. Towards the end of the second phase 302, a first steady-state Q302 representing a thermal equilibrium state between the electricity meter 2 and the operating environment 100 is reached at a temperature of approx. 78° C. after a time period d302 of approx. 24 s between the first step change C301 and the first steady state Q302.

At a second step change C302, a sudden drop of the electrical load of the bus bar 14 takes place in that the current drops from 100 A to 50 A. Accordingly, the heat transfer 214 drops to approx. 12 W in addition to the heat transfers 216, 217, 218, 219, 220. Consequently, during a third phase 303 of the thermal performance plot, a rapid temperature decrease 303 takes place from the approx. 78° C. in the first steady-state Q302 to a temperature of approximately 42° C. in a second steady-state Q303.

Figure 4:
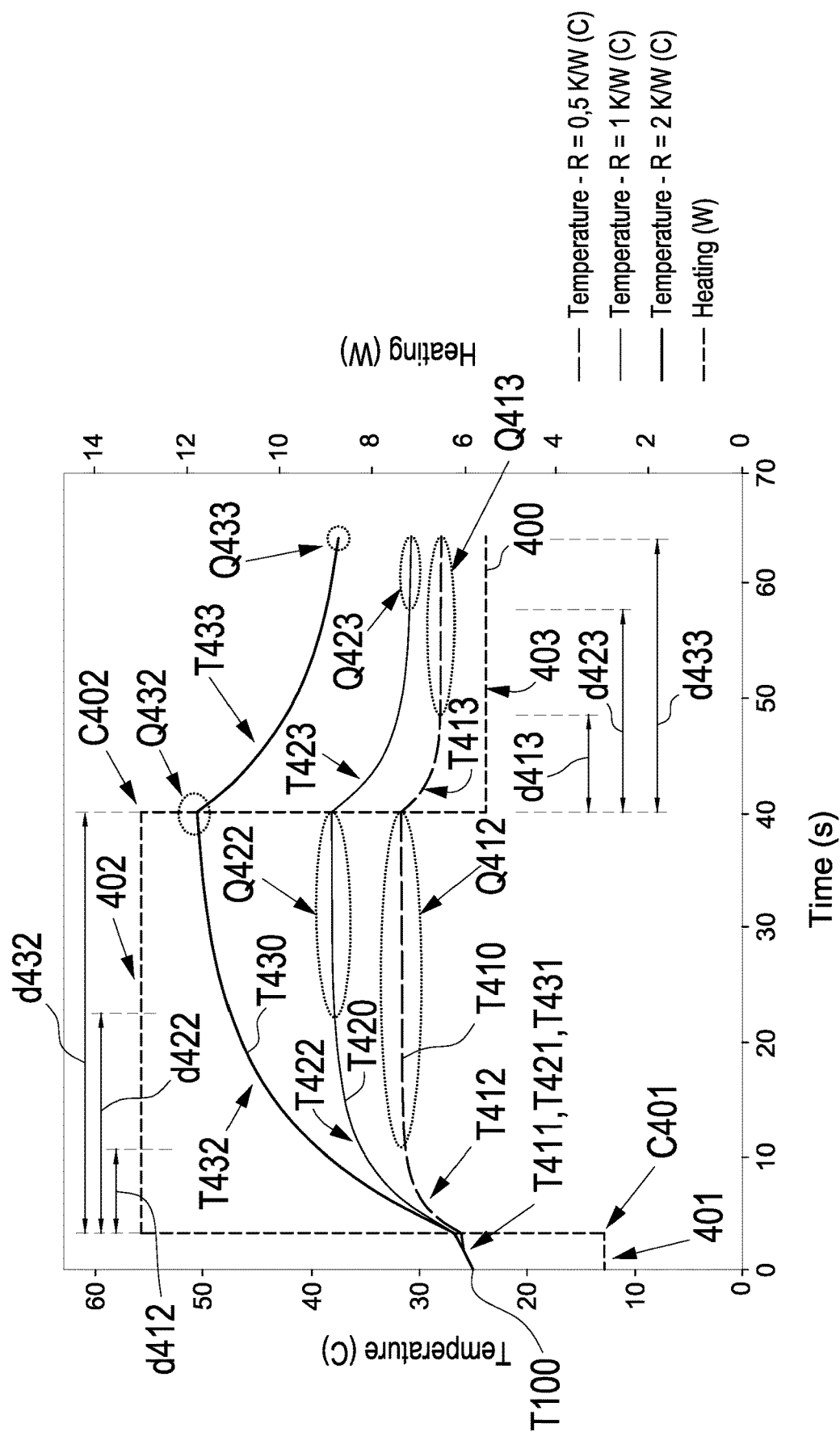
FIG. 4 shows an exemplary diagram illustrating effects of thermal resistance in a thermal model according to the present invention for modelling a thermal behaviour of an electricity meter.

FIG. 4 shows an exemplary diagram illustrating effects of thermal resistance in a thermal model according to the present invention for modelling a thermal behaviour of the electricity meter 2. In the present example, based on a thermal performance plot 400, the modelled thermal behaviour leads to three different temperature curves T410, T420, and T430 which are based on three different thermal resistance values Rth of 0.5 K/W, 1 K/W, and 2 K/W, respectively, assumed for the electricity meter 2. Commonly, the thermal resistance values Rth are determined by the enclosure 10 of the electricity meter 2, in particular by the thickness and material properties of the wall sections 10a, 10b, 10c, 10d, and of the terminal cover 10e with their specific heat transfer coefficients. The temperature curves T410, T420, and T430, for example represent the inner temperature T25 of the electricity meter 2.

In a first phase 401 of the thermal performance plot 400, a heat transfer from internal microelectronic circuits of the electricity meter 2, which for example again comprises heat transfers 216, 217, 218, 219, 220 pertaining to the supply disconnect switch 16, metering unit 17, processing unit 18, communications unit 19, and/or power supply unit 20, respectively, amounting to approx. 3 W, leads to a slow temperature increase T411, T421, and T431 in the temperature curves T410, T420, and T430, respectively, starting from the external ambient temperature T100 of approx. 25° C. representing the temperature of the operating environment 100.

At a first step change C401 in the thermal performance plot 400, a sudden rise in heat generation of approx. 10 W, e.g. by the bus bar 14 due to a respective current load being applied to the bus bar 14 and associated parts in the primary current path of the electricity meter 2, sets in. Thus, in a second phase 402 of the thermal performance plot 400, rapid temperature increases T412, T422, and T432, take place in the in the temperature curves T410, T420, and T430, respectively, due to the respective heat transfer 214 of approx. 10 Win addition to the heat transfers 216, 217, 218, 219, 220.

During the second phase 402, first steady-states Q412, Q422 and Q432 representing thermal equilibrium states between the electricity meter 2 and the operating environment 100 are reached at temperatures of approx. 31° C., 38° C. and 50° C. in the temperature curves T410, T420, and T430, respectively. The first steady-states Q412, Q422 and Q432 are reached after time periods d412, d422 and d432 of approx. 8 s, 22 s and 40 s, respectively, after the first step change C401. The differences in the temperatures reached at the first steady-states Q412, Q422 and Q432 and the differences in the time periods d412, d422 and d432 until reaching the first steady-states Q412, Q422 and Q432, respectively, arise from the respective different thermal resistance values Rth of 0.5 K/W, 1 K/W, and 2 K/W assumed for the electricity meter 2. It becomes evident that with increasing thermal resistance, a heat sink performance of the electricity meter 2 decreases, i.e. after a step change with rising heat generation, equilibrium temperatures with corresponding steady heat transfers 209, 210, 210d, 260 crossing the envelope boundary towards 200 the operating environment 100 are reached later and are higher, the higher, the thermal resistance value is. In other words, the lower the thermal resistance is, the higher are the heat transfers 209, 210, 210d, 260 during the time periods d412, d422 and d432.

At a second step change C402, a sudden drop of the electrical load of the bus bar 14 takes place. Accordingly, the heat transfer 214 drops to approx. 1.5 W in addition to the heat transfers 216, 217, 218, 219, 220. Consequently, during a third phase 403 of the thermal performance plot, rapid temperature decreases T413, T423, and T433 take place in the in the temperature curves T410, T420, and T430, respectively. In the present example, temperatures drop from temperatures of approx. 31° C., 38° C. and 50° C. in the first steady-states Q412, Q422 and 0432 to temperatures of approx. 28° C., 31° C. and 38° C. in second steady-states Q413, Q423 and Q433 for the temperature curves T410, T420, and T430, respectively. The second steady-states Q413, Q423 and Q433 are reached after time periods d413, d423 and d433 of approx. 9 s, 18 s and 24 s, respectively, after the first step change C401.

Hence, in analogy to the impact of the respective different thermal resistance values Rth of 0.5 K/W, 1 K/W, and 2 K/W on the heat sink behaviour of the electricity meter 2, it becomes evident that with increasing thermal resistance, a heat source performance of the electricity meter 2 based on heat transfers 209, 210, 210d, 260 crossing the envelope boundary towards 200 the operating environment 100 decreases, i.e. after a step change with falling heat generation, equilibrium temperatures are reached later and are higher, the higher, the thermal resistance value is. Correspondingly, the lower the thermal resistance is, the higher are the heat transfers 209, 210, 210d, 260 during the time periods d413, d423 and d433.

Figure 5:
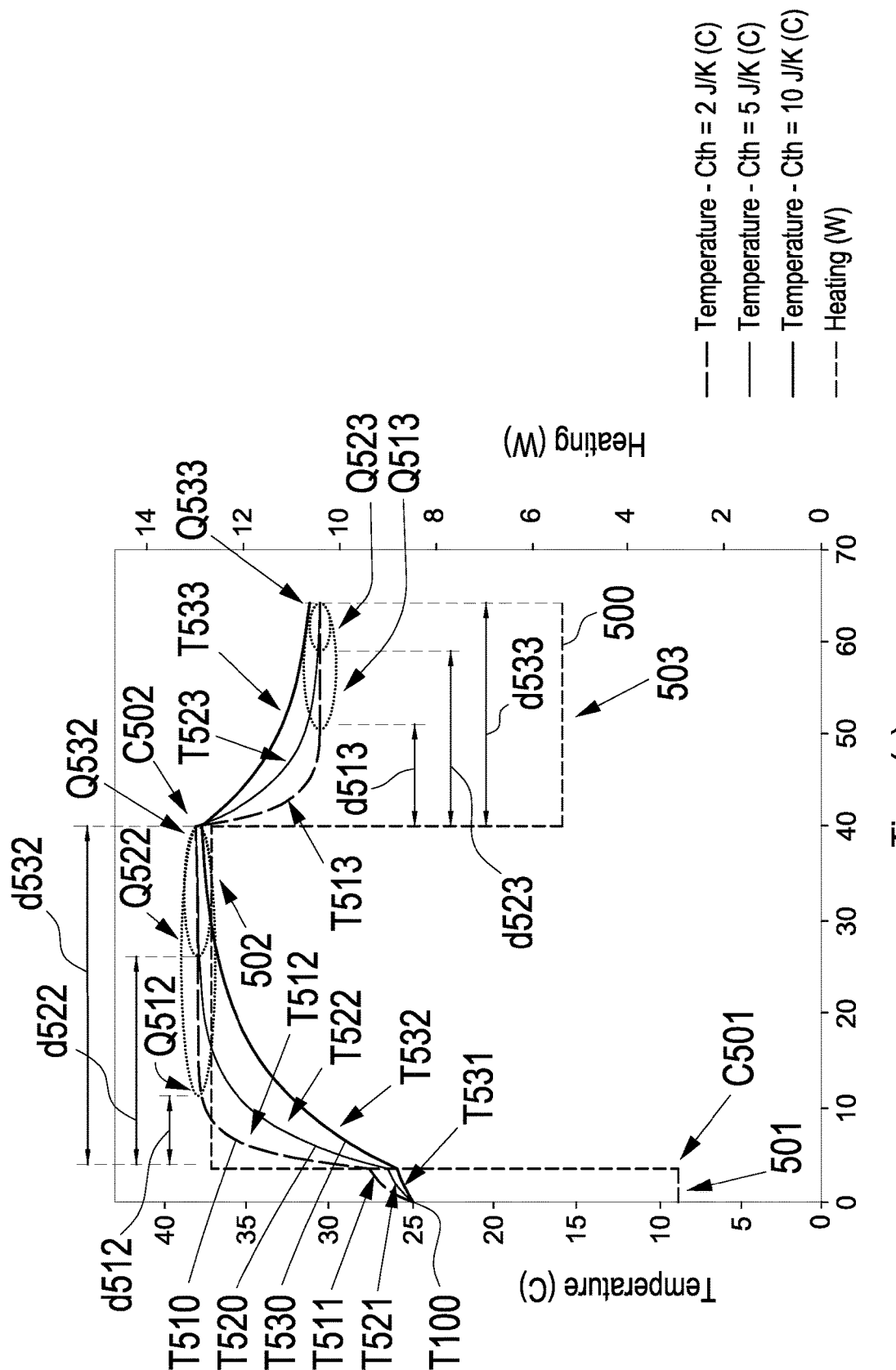
FIG. 5 shows an exemplary diagram illustrating effects of thermal capacitance in a thermal model according to the present invention for modelling a thermal behaviour of an electricity meter.

FIG. 5 shows an exemplary diagram illustrating effects of thermal capacitance in a thermal model according to the present invention for modelling a thermal behaviour of the electricity meter 2. In the present example, based on a thermal performance plot 500, the modelled thermal behaviour leads to three different temperature curves T510, T520, and T530 which are based on three different thermal capacitance values Cth of 2 J/K, 5 J/K, and 10 J/K, respectively, assumed for the electricity meter 2. The temperature curves T510, T520, and T530, for example represent the inner temperature T25 of the electricity meter 2. In the present example, a thermal resistance Rth of 1 K/W is assumed for the modelled thermal behaviour leads to three different temperature curves T510, T520, and T530. The thermal performance plot 500 and the temperature curve T520 equal the thermal performance plot 400 and temperature curve T420, respectively, illustrated in FIG. 4.

In a first phase 501 of the thermal performance plot 500, a heat transfer from internal microelectronic circuits of the electricity meter 2, which for example again comprises heat transfers 216, 217, 218, 219, 220, pertaining to the supply disconnect switch 16, metering unit 17, processing unit 18, communications unit 19, and/or power supply unit 20, respectively, amounting to approx. 3 W, leads to a slow temperature increase T511, T521, and T531 in the temperature curves T510, T520, and T530, respectively, starting from the external ambient temperature T100 of approx, 25° C. representing the temperature of the operating environment 100. Effects of the different thermal capacitance values Cth of 2 J/K, 5 J/K, and 10 J/K already become evident based on the relatively low heat transfer from internal microelectronic circuits of the electricity meter 2 alone, as differences in the slow temperature increases T511, T521, and T531 are significant. During the slow temperature increases T511, T521, and T531, temperatures rise from T100 of 25° C. to approx. 25.5° C., 26° C., and 27° C., respectively, reflecting a strong effect of thermal capacitance on the thermal behaviour of the electricity meter 2 on temperature gradients, i.e. slopes of temperature curves.

At a first step change C501 in the thermal performance plot 500, a sudden rise in heat generation of approx. 10 W, e.g. by the bus bar 14 due to a respective current load being applied to the bus bar 14 and associated parts and the primary current path of the electricity meter 2, sets in. Thus, in a second phase 502 of the thermal performance plot 500, rapid temperature increases T512, T522, and T532, take place in the in the temperature curves T510, T520, and T530, respectively, due to the respective heat transfer 214 of approx. 10 W in addition to the heat transfers 216, 217, 218, 219, 220.

During the second phase 502, first steady-states Q512, Q522 and Q532 representing thermal equilibrium states between the electricity meter 2 and the operating environment 100 are reached at a temperature of approx. 38° C. in the temperature curves T510, T520, and T530, respectively. The first steady-states Q512, Q522 and Q532 are reached after time periods d512, d522 and d532 of approx. 8 s, 22 s and 37 s, respectively, after the first step change C501. The differences in the time periods d512, d522 and d532 until reaching the first steady-states Q512, Q522 and Q532, respectively, arise from the respective different thermal capacitance values Cth of 2 J/K, 5 J/K, and 10 J/K assumed for the electricity meter 2. It becomes evident that with increasing thermal capacitance, a heat buffering performance of the electricity meter 2 increases, i.e. after a step change with rising heat generation, an equilibrium temperature with corresponding steady heat transfers 209, 210, 210d, 260 crossing the envelope boundary 200 towards the operating environment 100 are reached later, the higher, the thermal capacitance value is. In other words, the lower the thermal capacitance is, the higher are the heat transfers 209, 210, 210d, 260 during the time periods d512, d522 and d532.

At a second step change C502, a sudden drop of the electrical load of the bus bar 14 takes place. Accordingly, the heat transfer 214 drops to approx. 1.5 W in addition to the heat transfers 216, 217, 218, 219, 220. Consequently, during a third phase 503 of the thermal performance plot, rapid temperature decreases T513, T523, and T533 take place in the in the temperature curves T510, T520, and T530, respectively. In the present example, temperatures drop from temperatures of approx. 38° C. in the first steady-states Q512, Q522 and Q532 to temperatures of approx. 31° C. in second steady-states Q513, Q523 and Q533 for the temperature curves T510, T520, and T530, respectively. The second steady-states Q513, Q523 and Q533 are reached after time periods d513, d523 and d533 of approx. 11 s, 18 s and 24 s, respectively, after the first step change C501.

Hence, by the impact of the respective different thermal capacitance values Cth of 2 J/K, 5 J/K, and 10 J/K on the heat buffering behaviour of the electricity meter 2, it becomes evident that with increasing thermal capacitance, a heat storage performance of the electricity meter 2 based on heat transfers 209, 210, 210d, 260 crossing the envelope boundary towards 200 the operating environment 100 increases, i.e. after a step change with falling heat generation, equilibrium temperatures are reached later, the higher, the thermal capacitance value Cth is. Correspondingly, the lower the thermal capacitance value Cth is, the lower are the heat transfers 209, 210, 210d, 260 during the time periods d513, d523 and d533.

Figure 6:
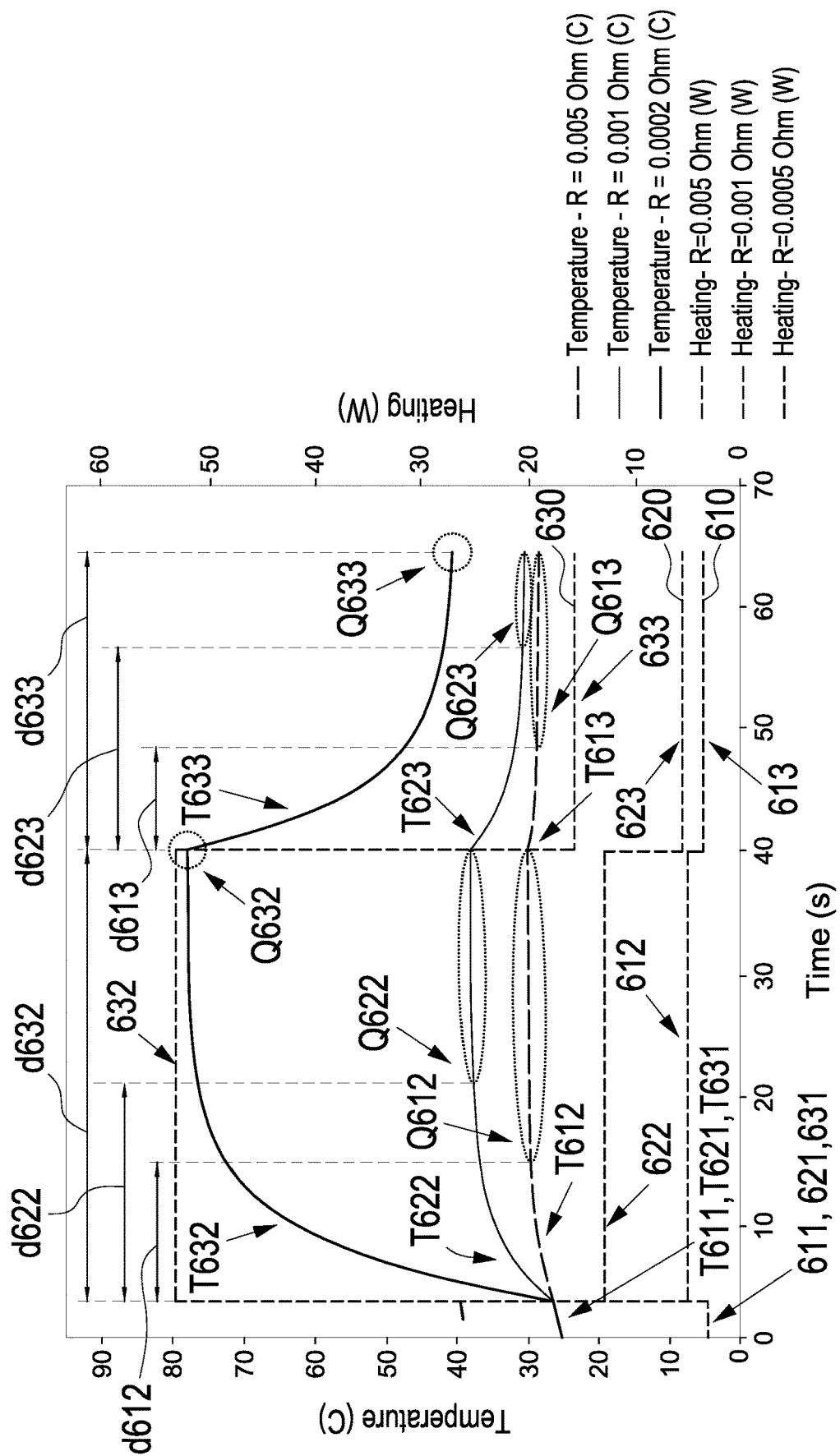
FIG. 6 shows an exemplary diagram illustrating effects of electrical resistance in a primary current path of an electricity meter considered in a thermal model according to the present invention for modelling a thermal behaviour of an electricity meter.

FIG. 6 shows an exemplary diagram illustrating effects of electrical resistance in a primary current path of the electricity meter 2 considered in a thermal model according to the present invention for modelling a thermal behaviour of an electricity meter 2. In the present example, based on three thermal performance plots 610, 620, and 630 which are emulated based on three different electrical capacitance values R of 0.0002 Ohm, 0.001 Ohm, and 0.005 Ohm, respectively, assumed for the primary current path of the electricity meter 2. The modelled thermal behaviour leads to three different temperature curves T610, T620, and T630, pertaining to the electrical capacitance values R of 0.0002 Ohm, 0.001 Ohm, and 0.005 Ohm, respectively. The temperature curves T610, T620, and T630, for example represent the inner temperature T25 of the electricity meter 2.

In first phases 611, 621, and 631, of the thermal performance plot 610, 620, and 630, respectively, equal heat transfers from internal microelectronic circuits of the electricity meter 2, which for example again comprise respective heat transfers 216, 217, 218, 219, 220, pertaining to the supply disconnect switch 16, metering unit 17, processing unit 18, communications unit 19, and/or power supply unit 20, respectively, amounting to approx. 3 W, lead to uniform slow temperature increases T611, T621, and T631 in the temperature curves T610, T620, and T630, respectively, starting from the external ambient temperature T100 of approx. 25° C. representing the temperature of the operating environment 100.

At first step changes C611, C621, and C631 in the thermal performance plots 610, 620, and 630, sudden rises in heat generation of approx. 2 W, 10 W, and 50 W, respectively, e.g. by the bus bar 14 due to a respective current load being applied to the bus bar 14 and associated parts in the primary current path of the electricity meter 2, set in. Thus, in second phases 612, 622, and 632 of the thermal performance plots 610, 620, and 630, respectively, rapid temperature increases T612, T622, and T632, take place in the in the temperature curves T610, T620, and T630 due to the respective heat transfers 214 of approx. 2 W, 10 W, and 50 W, respectively, in addition to the heat transfers 216, 217, 218, 219, 220.

During the second phases 612, 622, and 632, first steady-states Q612, Q622 and Q632 representing thermal equilibrium states between the electricity meter 2 and the operating environment 100 are reached at temperatures of approx. 29° C., 38° C., and 78° C. in the temperature curves T610, T620, and T630, respectively. The first steady-states Q612, Q622 and Q632 are reached after time periods d612, d622 and d632 of approx. 12 s, 18 s and 37 s, respectively, after the first step change C601. The differences in the time periods d612, d622 and d632 until reaching the first steady-states Q612, Q622 and Q632, respectively, arise from the respective different heat transfers 214 of approx. 2 W, 10 W, and 50 W. With increasing electrical resistance, a heat generating performance of the electricity meter 2 increases, i.e. after a step change with rising heat generation, equilibrium temperatures with corresponding steady heat transfers 209, 210, 210d, 260 crossing the envelope boundary 200 towards the operating environment 100 are reached later and at higher temperatures, the higher, the electrical resistance value R is.

At a second step change C602, a sudden drop of the electrical load of the bus bar 14 takes place. Accordingly, the heat transfers 214 drop to approx. 1.5 W, 2 W, and 12 W in the thermal performance plots 610, 620, and 630, respectively, in addition to the heat transfers 216, 217, 218, 219, 220. Consequently, during third phases 613, 623, and 633, of the thermal performance plots 610, 620, and 630, rapid temperature decreases T613, T623, and T633 take place in the in the temperature curves T610, T620, and T630, respectively. In the present example, temperatures drop from temperatures of approx. 29° C., 38° C., and 78° C. in the first steady-states Q612, Q622 and Q632, respectively, to temperatures of approx. 29° C., 28° C., and 42° C. in second steady-states Q613, Q623 and Q633 for the temperature curves T610, T620, and T630, respectively. The second steady-states Q613, Q623 and Q633 are reached after time periods d613, d623 and d633 of approx. 9 s, 18 s and 24 s, respectively, after the first step change C601.

Hence, with increasing electrical resistance of the primary current path, a heat generation performance of the electricity meter 2 based on heat transfers 209, 210, 210d, 260 crossing the envelope boundary towards 200 the operating environment 100 increases, i.e. after a step change with falling heat generation, equilibrium temperatures are higher and reached later, the higher, the electrical resistance value of the primary current path is. Correspondingly, the lower the electrical resistance value is, the lower are the heat transfers 209, 210, 210d, 260 and respective equilibrium temperatures.

Figure 7:
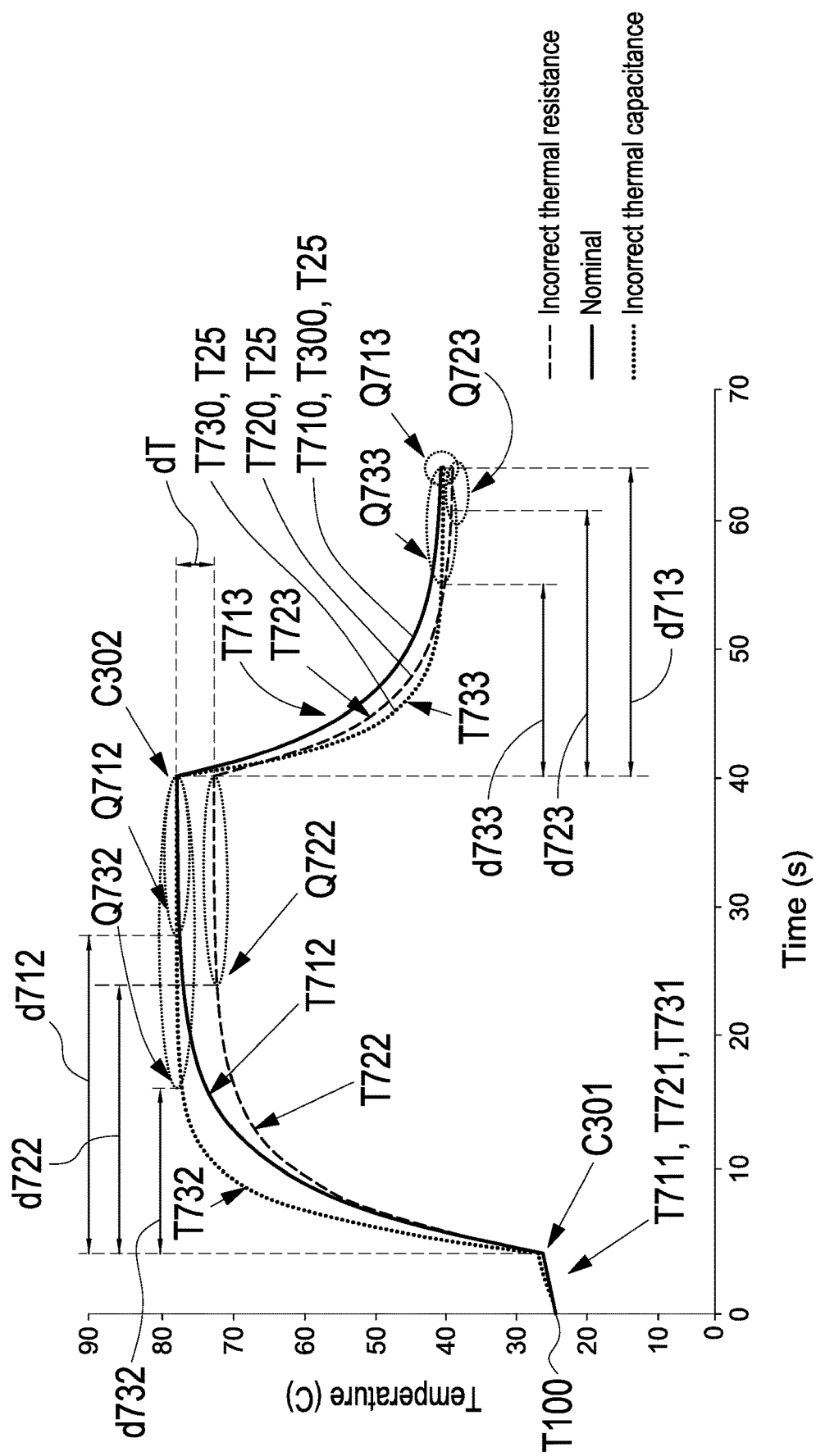
FIG. 7 shows an exemplary diagram illustrating modelling deviations which may occur when establishing a thermal model according to the present invention for modelling a thermal behaviour of an electricity meter.

FIG. 7 shows an exemplary diagram illustrating modelling deviations which may occur when establishing a thermal model according to the present invention for modelling a thermal behaviour of the electricity meter 2. In the present example, based on thermal performance plot 300 (see FIG. 3), the modelled thermal behaviour leads to three different temperature curves T710, T720, and T730 which are based on nominal parameters for thermal resistance as well as thermal capacity, incorrect thermal resistance, and incorrect thermal capacity, respectively, assumed for the electricity meter 2. The temperature curves T710, T720, and T730, for example each represent the inner temperature T25 of the electricity meter 2.

In the first phase 301 of the thermal performance plot 300, the heat transfer from internal microelectronic circuits of the electricity meter 2, which for example again comprises heat transfers 216, 217, 218, 219, 220, pertaining to the supply disconnect switch 16, metering unit 17, processing unit 18, communications unit 19, and/or power supply unit 20, respectively, amounting to approx. 3 W, leads to slow temperature increases T711, T721, and T731 in the temperature curves T710, T720, and T730, respectively, starting from the external ambient temperature T100 of approx. 25° C. representing the temperature of the operating environment 100. Effects of the incorrect thermal capacitance value already become evident based on the relatively low heat transfer from internal microelectronic circuits of the electricity meter 2 alone, as differences in the slow temperature increases T711, T721, and T731 are noticeable. During the slow temperature increases T711, T721, and T731, temperatures rise from T100 of 25° C. to approx. 27° C. as well as 27° C., and 27.5° C., respectively, reflecting a strong effect of thermal capacitance on the thermal behaviour of the electricity meter 2 on temperature gradients, i.e. slopes of temperature curves.

At the first step change C301 in the thermal performance plot 300, the sudden rise in heat generation of approx. 50 W, e.g. by the bus bar 14 due to the respective current load being applied to the bus bar 14 and associated parts and the primary current path of the electricity meter 2, sets in. Thus, in the second phase 302 of the thermal performance plot 700, rapid temperature increases T712, T722, and T732, take place in the in the temperature curves T710, T720, and T730, respectively, due to the respective heat transfer 214 of approx. 50 W in addition to the heat transfers 216, 217, 218, 219, 220.

During the second phase 302, first steady-states Q712, Q722 and Q732 representing thermal equilibrium states between the electricity meter 2 and the operating environment 100 are reached at a temperature of approx. 78° C., 71° C., and 78° C. in the temperature curves T710, T720, and T730, respectively. The first steady-states Q712, Q722 and Q732 are reached after time periods d712, d722 and d732 of approx. 24 s, 20 s and 12 s, respectively, after the first step change C301. The differences in the time periods d712, d722 and d732 until reaching the first steady-states Q712, Q722 and Q732, respectively, reflect the deviations from the nominal values assumed for the thermal resistance Rth and the thermal capacitance Cth of the electricity meter 2.

At the second step change C302, the sudden drop of the electrical load of the bus bar 14 takes place. Accordingly, the heat transfer 214 drops to approx. 12 W in addition to the heat transfers 216, 217, 218, 219, 220. Consequently, during the third phase 303 of the thermal performance plot 300, rapid temperature decreases T713, T723, and 1733 take place in the in the temperature curves T710, T720, and 1730, respectively. In the present example, temperatures drop from temperatures of approx. 78° C., 71° C., and 78° C. in the first steady-states Q712, Q722 and Q732 to temperatures of approx. 40° C., 38° C., and 40° C. in second steady-states Q713, Q723 and Q733 for the temperature curves T710, T720, and T730, respectively. The second steady-states Q713, Q723 and Q733 are reached after time periods d713, d723 and d733 of approx. 11 s, 18 s and 24 s, respectively, after the first step change C701.

It becomes evident that deviations in thermal resistance lead to deviations in both, a different temperature difference dT with respect to the temperature assumed for the nominal parameters, and a difference in time periods between a step change and reaching a next equilibrium state, whereas deviations of the thermal capacitance from the nominal parameters merely leads to the latter.

Figure 8:
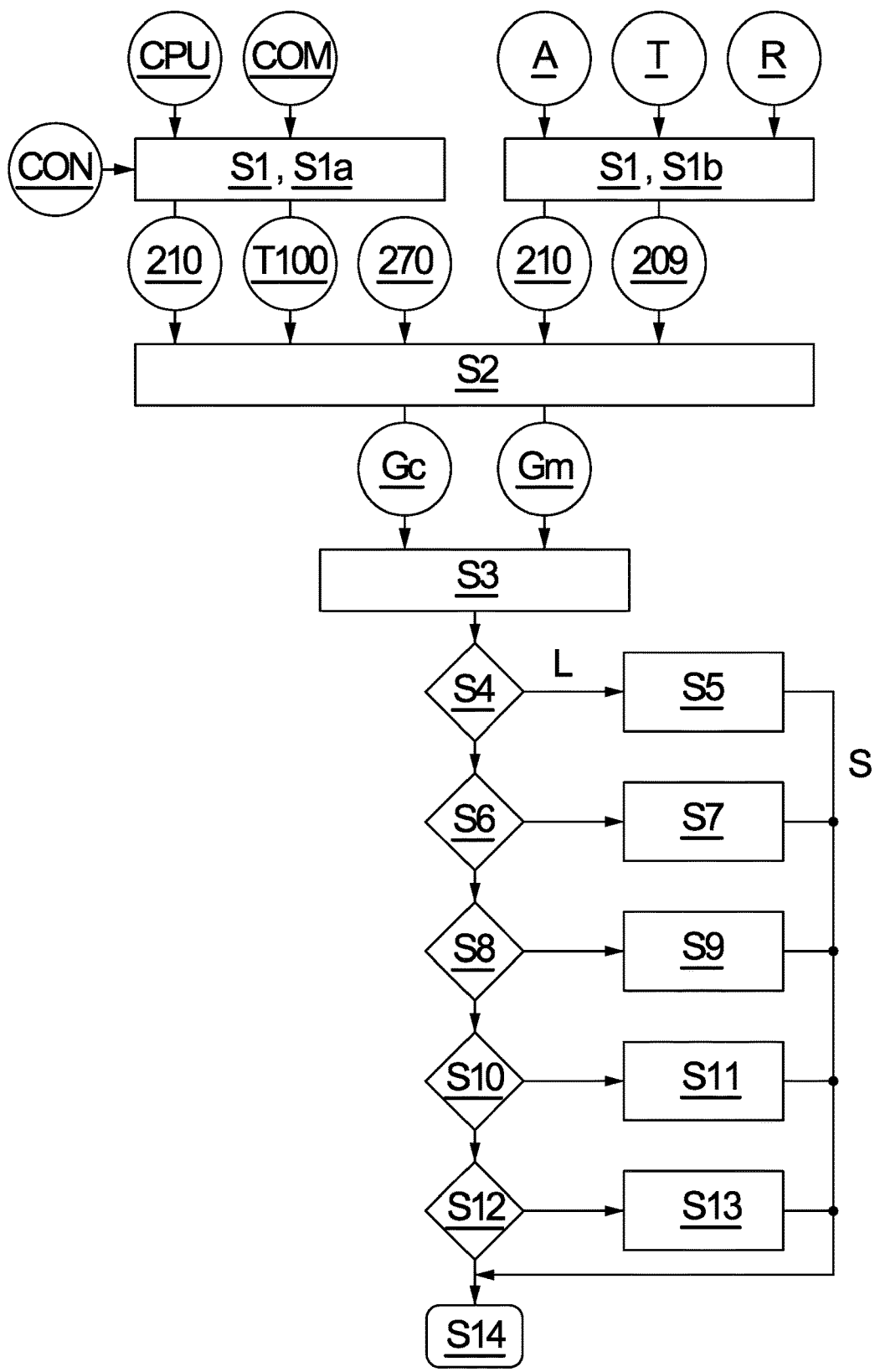
FIG. 8 shows an exemplary flowchart illustrating steps of establishing a thermal model according to the present invention for modelling a thermal behaviour of an electricity meter.

FIG. 8 shows an exemplary flowchart illustrating steps of establishing a thermal model according to the present invention for modelling a thermal behaviour of the electricity meter 2. In a first step S1, heat generation within the electricity meter 2 is calculated. In particular, in a first substep S1a, heat generation in microelectronic components and units is calculated, e.g. heat transfers 216, 217, 218, 219, 220, pertaining to the supply disconnect switch 16, metering unit 17, processing unit 18, communications unit 19, and/or power supply unit 20, respectively, based on a configuration status CON, a CPU load CPU and a communications status COM of the electricity meter 2. In a second subs step S1b, heat generation by the bus bar 14 and associated parts and the primary current path of the electricity meter 2 is calculated while taking into account a current load A being applied to the busbar 14, temperature T of the busbar 14 and/or the inner temperature T25 of the electricity meter 2, and electrical resistance R of primary current path. As output values of the first and second substeps S1a, S1b, heat dissipation from the electricity meter 2 due to heat transfer 210 and alike crossing the envelope boundary 200 is calculated for both, the microelectronic components and the primary current path of the electricity meter 2. In addition, heat dissipation and/or absorption due to heat transfer 209 and alike crossing the envelope boundary 200 is calculated for the primary current path of the electricity meter 2.

In a second step S2, the output values of step S1 along with minimum and maximum values of the ambient temperature T100 and heat transfer 270 from external heat sources 170, temperature gradients characterising the thermal behaviour of the electricity meter 2 are calculated as a computed or emulated gradient Gc based on the thermal modelling and a measured gradient Gm making use of temperature sensors 21. Output values of the second step are minimum and maximum values for the computed gradient Gc and the measured gradient Gm.

In a third step S3, as input values, the minimum and maximum values for the computed gradient Gc and the measured gradient Gm are used for computing respective temperature gradient and/or temperature value errors and/or deviations.

In a fourth step S4, the temperature gradient errors and/or deviations computed in the third step S3 are checked against respective error ranges and/or threshold values used as limits L. If such limits L are exceeded, then in the fifth step S5, respective triggering signal S is generated, such that a respective event is logged, an alarm is initiated, and/or the supply disconnect switch 16 is actuated.

A sixth step S6 follows the fourth step S4 if it has been decided in the fourth step S4 that the respective limits L were not exceeded. Then, in the sixth step S6 it is checked if any temperature gradient and/or temperature value errors and/or deviations are due to self heating of the electricity meter 2 as a result of heat generation in microelectronic components, e.g. by heat transfers 216, 217, 218, 219, 220, for instance by taking into account the configuration status CON, the CPU load CPU and the communications status COM as well as any required temperature value T derived from temperature sensors 21. If it is decided in the sixth step S6 that temperature gradient and/or temperature value errors and/or deviations are due to self heating of the electricity meter 2, then in a seventh step S7, respective parameters, in particular heat transfers 216, 217, 218, 219, 220, the configuration status CON, the CPU load CPU and/or the communications status COM, used as input values in step 1, are adjusted accordingly.

An eighth step S8 follows the sixth step S6 if it has been decided in the sixth step S6 that temperature gradient and/or temperature value errors and/or deviations are not due to self heating of the electricity meter 2. Then, in the eighth step S8 it is decided, if any temperature gradient and/or temperature value errors and/or deviations are due to heating of the primary current path, in particular the busbar 14 of the electricity meter 2, e.g. by taking into account respective heat transfers 214 and any one of temperature sensors 21 associated to the busbar 14. If it is decided in the eighth step S8 that temperature gradient and/or temperature value errors and/or deviations are due to heating of the primary current path, in particular the busbar 14, then in a ninth step S9, the value of the electrical resistance R associated to the primary current path, in particular the busbar 14, used as input value in step 1 is adjusted accordingly.

A tenth step S10 follows the eighth step S8, if it has been decided in the eighth step S8 that temperature gradient and/or temperature value errors and/or deviations are not due to heating of the primary current path, in particular the busbar 14, of the electricity meter 2, Then, in the tenth step S10 it is decided, if any temperature gradient and/or temperature value errors and/or deviations are due to the heat transfer 270 from external heat sources 170, in particular by using respective temperature sensors 21 associated thereto. If it is decided in the eighth step S8 that temperature gradient and/or temperature value errors and/or deviations are due to heating the heat transfer 270 from external heat sources 170, then in an eleventh step S11, the values considered for computing the respective heat transfer 270, in particular outside temperatures T used as input values in step 1, are adjusted accordingly.

A tenth step S10 follows the eighth step S8, if it has been decided in the eighth step S8 that temperature gradient and/or temperature value errors and/or deviations are not due to heating of the primary current path, in particular the busbar 14, of the electricity meter 2. Then, in the tenth step S10 it is decided, if any temperature gradient and/or temperature value errors and/or deviations are due to the heat transfer 270 from external heat sources 170, in particular by using respective temperature sensors 21 associated thereto. If it is decided in the tenth step S10 that temperature gradient and/or temperature value errors and/or deviations are due the heat transfer 270 from external heat sources 170, then in the eleventh step S11, the values considered for computing the respective heat transfer 270 are adjusted accordingly.

A twelfth step S12 follows the tenth step S10, if it has been decided in the tenth step S10 that temperature gradient and/or temperature value errors and/or deviations are not due to heat transfer 270 from external heat sources 170. Then, in the twelfth step S12 it is decided, if any temperature gradient and/or temperature value errors and/or deviations are due to the heat transfer 209 via the electrical lines 9, in particular by using respective temperature sensors 21 associated thereto. If it is decided in the twelfth step S12 that temperature gradient and/or temperature value errors and/or deviations are due to the heat transfer 270 from external heat sources 170, then in a thirteenth step S13, the values considered for computing the respective heat transfer 209 are adjusted accordingly.

In a fourteenth step S14, following the fifth step S5, the seventh step S7, the ninth step S9, the eleventh step S11, the twelfth step 12, and/or the thirteenth step 13, the procedure shown in FIG. 8 is terminated and/or repeated in beginning again from the first step S1.

Figure 9:
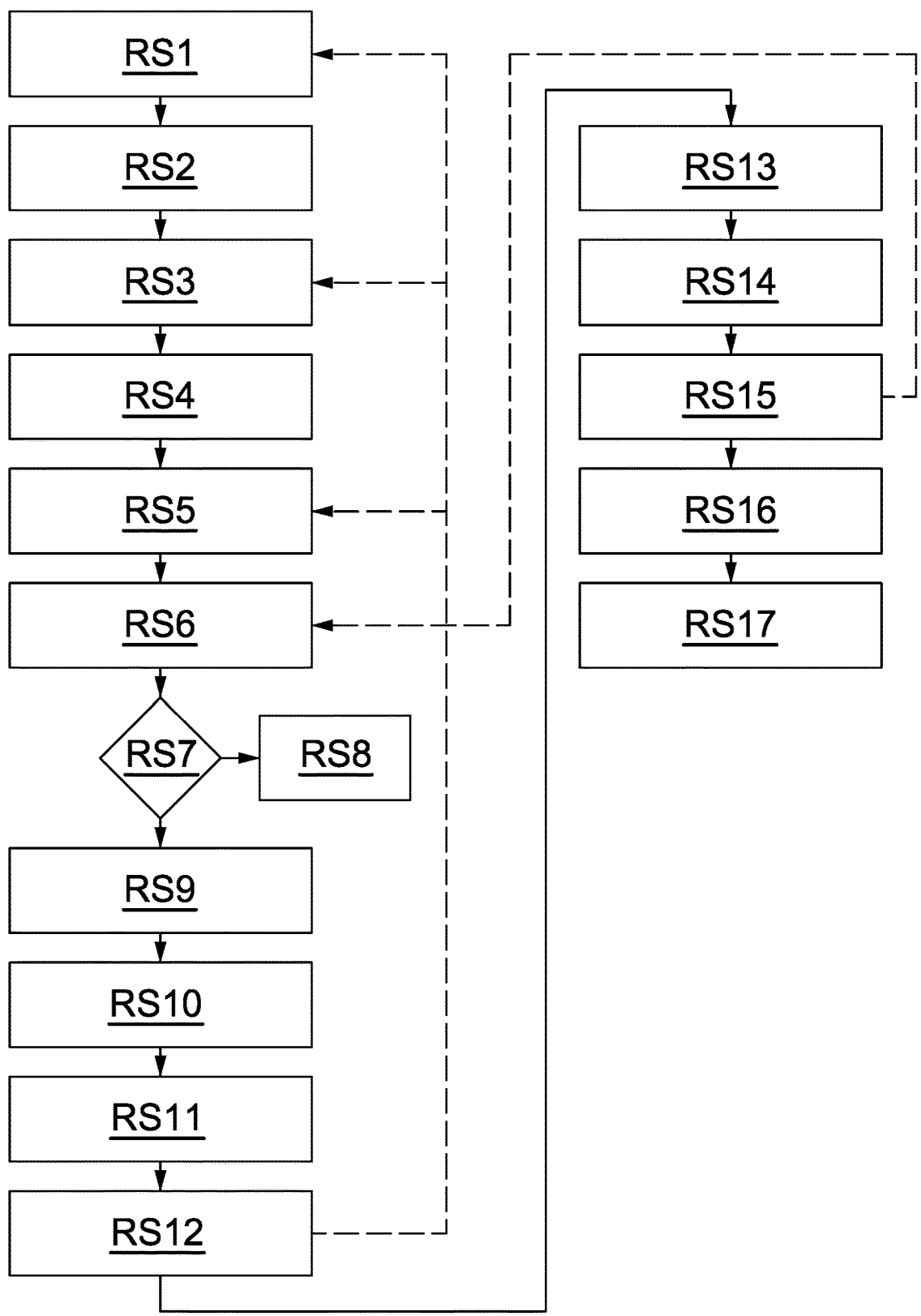
FIG. 9 shows an exemplary flowchart illustrating steps of a runtime logic of an electricity meter when establishing a thermal model according to the present invention for modelling a thermal behaviour of an electricity meter.

FIG. 9 shows an exemplary flowchart illustrating steps of a runtime logic of the electricity meter 2 when establishing a thermal model according to the present invention for modelling a thermal behaviour of the electricity meter 2. The runtime logic are computer-readable instructions, such as software and/or firmware, constituting at least a part of the computer program 4, to be executed by the supply disconnect switch 16, metering unit 17, processing unit 18, communications unit 19, and/or power supply unit 20.

In a first runtime step RS1, instantaneous temperature values T and computed temperature gradient values Gc are continuously generated under using formulas for thermal capacitance Cth and thermal resistance Rth to model the electricity meter 2, while using readings from at least one of the temperature sensors 21, measurements of current load A, and/or microelectronic heating estimates, in particular for heat transfers 216, 217, 218, 219, and 220, pertaining to the metering unit 17, processing unit 18, communications unit 19, and/or power supply unit 20, respectively.

The thermal model is based on the following three equations used for calculating temperatures T as a function of time t:

$$T(t) = T_0 \times (1 - e^{(-t/\lambda)}), \tag{1}$$

wherein T(t) [K] is the instantaneous temperature during a heating phase of the electricity meter 2, $T_0$ [K] is the final steady state instantaneous temperature of the electricity meter 2, and λ [1/s] is a time constant resulting from a multiplication of thermal resistance Rth and thermal capacitance Cth;

$$T(t) = T_0 \times (e^{(-t/\lambda)}), \tag{2}$$

wherein T(t) [K] is the instantaneous temperature during a cooling phase of the electricity meter 2, $T_o$ [K] is the initial instantaneous temperature of the electricity meter 2, and λ

[1/s] is the time constant resulting from a multiplication of thermal resistance Rth and thermal capacitance Cth; and $$\Delta T = Q \times R_{th}, \quad (3)$$

wherein ΔT [K] is a temperature difference between two points of an object, such as the electricity meter 2 as well as parts, elements, or components thereof, Q [W] the heat flow running through the object, and Rth [KM] is the thermal resistance between the two defined points of the object, for which thermal performance is emulated.

In a second runtime step RS2, multiple results for slight variations in model parameters over a range of potential model parameters, such as thermal capacitance Cth, thermal resistance Rth, electrical resistance R, and/or microelectronic heating factors, in particular for heat transfers 216, 217, 218, 219, and 220, pertaining to the metering unit 17, processing unit 18, communications unit 19, and/or power supply unit 20, respectively, are calculated.

In a third runtime step RS3, errors and/or deviations between measured results and model results, i.e. measured temperatures gradients thereof versus emulated temperatures and gradients thereof, are calculated.

In a fourth runtime step RS4, model parameters are identified, that yield the smallest error/deviation between measured results and emulated results.

In a fifth runtime step RS5, small incremental changes are made to the model parameters identified in the fourth runtime step RS4, in the direction and proportional to the identified model parameters that yielded the smallest error or deviation. For such an adjustment, filtering may be used, for example by applying a finite impulse response filter and/or infinite impulse response filter.

In a sixth runtime step RS6, the identified and adjusted model parameters from runtime step S are compared to pre-configured range limitations to detect when the thermal model being established is normalising to a certain thermal model that is indicate if of an error or fault condition, such as excessive electrical resistance in the primary current path, in particular the bus bar 14, and/or faults in microelectronic components.

In a seventh runtime step RS7, it is decided, whether parameters of certain thermal model from the sixth runtime step RS6, that indicate an error or fault condition, are out of a particular parameter range. Therefore, the respective model results are compared to respective threshold values. If the respective model parameters exceed the respective threshold values, then and error, fault and/or alarm event is recorded, and/or an additional action is taken, such as actuation of the supply disconnect switch 16, or alike.

In a ninth runtime step RS9, following the seventh runtime step RS7, points of interest are determined, such as steady-states, heating conditions, cooling conditions, and/or any relatively large variations in thermal energy generation.

In a tenth runtime step RS10, when the points of interest are identified in the ninth runtime step RS9, then corresponding information, including underlying thermal model parameters, such as instantaneous temperature T and temperature gradients G, current loads A, microelectronic heating estimates, and alike, are recorded.

In an eleventh runtime step RS11, information and parameters characterising points of interest recorded during the tenth runtime step RS 10, are used for adjusting model parameters and weighting of respective filter values of the finite impulse response filter and/or the infinite impulse response filter applied. For example, from a certain steady state, a sudden step change in load current A to near zero and the associated cooling provides an excellent opportunity to adjust the thermal capacitance Cth free from any error in estimated electrical resistance R in the primary current path. Alternatively, or additionally, a steady state condition provides an opportunity to adjust the thermal resistance Rth without the effect of thermal capacitance Cth complicating the calculation. Furthermore, a change in temperature T during a certain steady state while load current A and heating due to microelectronic heating factors, in particular heat transfers 216, 217, 218, 219, and 220, pertaining to the metering unit 17, processing unit 18, communications unit 19, and/or power supply unit 20, respectively, is relatively stable over time t, could be an indication of thermal changes in the operating environment 100.

In a twelfth runtime step RS12, thermal model results are again being computed, as done in the first runtime step RS 1, but now based on information and parameters recorded in runtime step R10 during points of interest, if applicable, as adjusted in the eleventh runtime step RS11. Analogously, in the twelfth runtime step RS12, respective errors and/or deviations between measured results and emulated results, i.e. measured temperatures gradients thereof versus emulated temperatures and gradients thereof, are calculated, similar to as done in the third runtime step RS3.

Furthermore, in the twelfth runtime step RS12, small incremental changes are made to the model parameters recorded in the tenth runtime step RS10, and/or as adjusted in the eleventh runtime step RS11, in the direction and proportional to the identified model parameters that yielded the smallest error or deviation, as done in the fifth runtime step RS5. For such an adjustment, the adjusted filter values may be used, as obtained by weighting of respective filter values in runtime step 11, for example when applying a finite impulse response filter and/or infinite impulse response filter. In other words, from the twelfth runtime step RS 12, information and parameters may be fed back to the first runtime steps RS1, the third runtime step RS3, and/or the fifth runtime step RS5, so that these steps are carried out in an iterative manner.

In a thirteenth runtime step RS13, model parameters obtained in previous runtime steps, in particular the twelfth runtime step RS12, are recorded as historical values of model parameters.

In a fourteenth runtime step RS 14, the historical model parameters recorded in the thirteenth runtime step RS13 are scanned in order to identify any large answers or suspicious value and/or parameter variations.

In a fifteenth runtime step RS15, variations in the historical model parameters recorded in the fourteenth runtime step RS14 are used to incrementally adjust range limits of model parameters. Respective adjusted range limits can be fed back to the sixth runtime step RS6 for the detection of error or fault conditions based on the respective range limits.

In a sixteenth runtime step RS16, maximum variations for each model parameter are recorded.

In a seventeenth runtime step RS17, the first to sixteenth runtime steps RS1 to RS16, as described above, can be repeated in order to compute thermal model results of multiple thermal models used to represent different parts, elements and/or components, within the electricity meter 2. Preferably, a single thermal model comprising a single thermal capacitance Cth and thermal resistance Rth is required and should be sufficient for modelling thermal behaviour of the electricity meter 2. However, in order to improve accuracy of a method for monitoring a functional state of an electricity meter 2 according to the present invention, thermal behaviour of different parts, element and/or components within the electricity meter 2 can be modelled as described herein.

Figure 10:
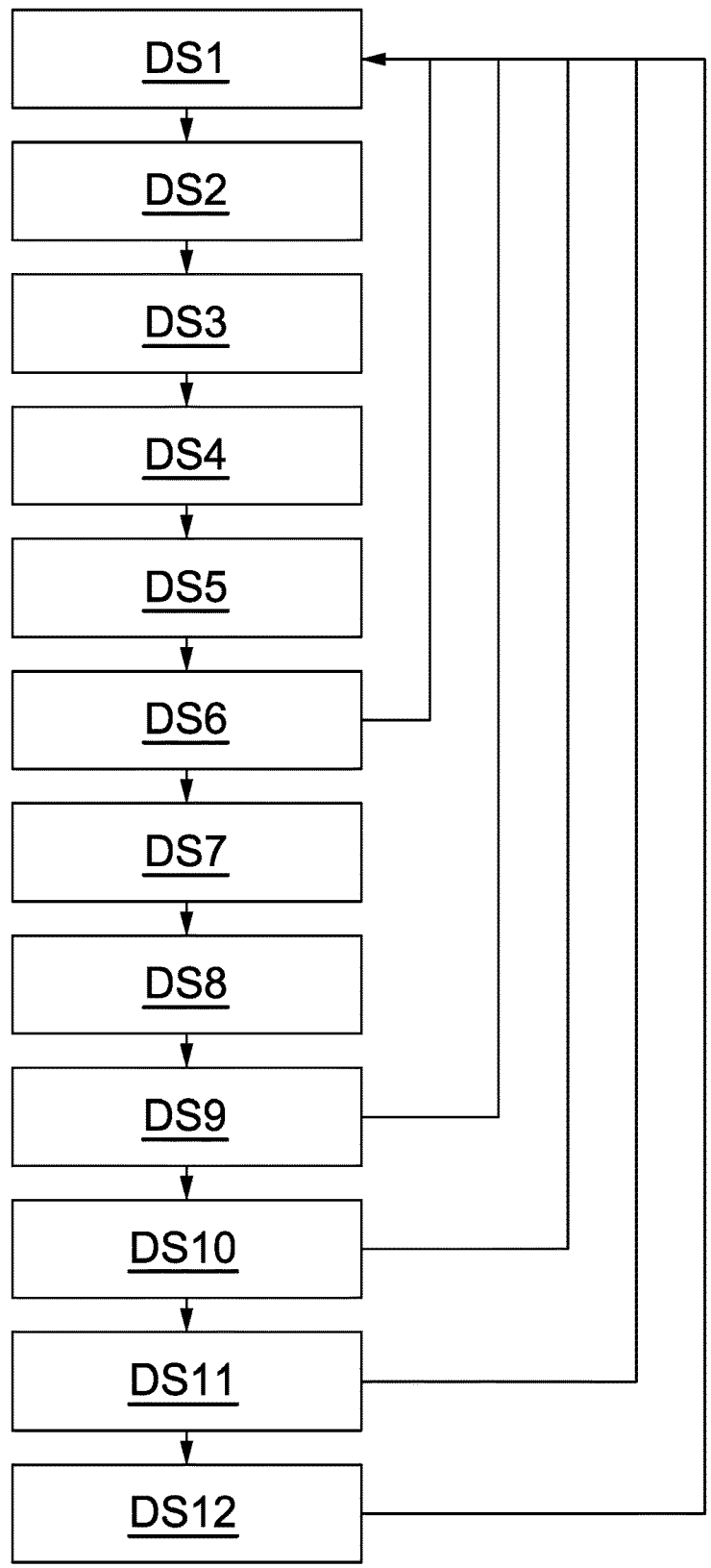
FIG. 10 shows an exemplary flowchart illustrating steps of a design time course thermal model discovery procedure when establishing a thermal model according to the present invention for modelling a thermal behaviour of an electricity meter.

FIG. 10 shows an exemplary flowchart illustrating steps of a design time course thermal model discovery procedure when establishing a thermal model according to the present invention for modelling a thermal behaviour of the electricity meter 2. The steps illustrated in FIG. 10 serve for providing initial parameters and values to be implemented in the method steps as described above with reference to FIGS. 8 and 9.

In a first design step DS1 of the design time course thermal model discovery procedure illustrated in FIG. 10, the electricity meter 2 in an un-energised state, i.e. the electricity meter is not electrically powered, is placed in a controlled temperature chamber (not illustrated) and allowed to reach a thermal equilibrium state with respect to the temperature chamber having the ambient temperature T100.

In a second design step DS2, the meter is energised without any load being applied to the primary current path, and with unvarying, i.e. steady micro-electronic behaviour to ensure that heating due to microelectronic heating factors, in particular heat transfers 216, 217, 218, 219, and 220, pertaining to the metering unit 17, processing unit 18, communications unit 19, and/or power supply unit 20, respectively, is relatively stable, preferably constant over time.

In a third design step DS3, a series of temperature readings from the point of time of energising the microelectronic parts of the electricity meter 2 carried out in the second design step DS2, until a point of time where the electricity meter 2 again reaches a thermal equilibrium state with respect to the temperature chamber, is recorded. Based on these temperature readings, thermal resistance Rth and/or capacitance Cth of the electricity meter 2 as well as, if desired, any parts, elements and/or components thereof, are calculated.

In a fourth design step DS4, microelectronic heating factors turned on in the second design step DS2, in particular heat transfers 216, 217, 218, 219, and 220, pertaining to the metering unit 17, processing unit 18, communications unit 19, and/or power supply unit 20, respectively, are abruptly eliminated by de-energising the electricity meter 2.

In a fifth design step DS5, the supply disconnect switch 16 is activated under various load conditions with altered magnitude and phase of electrical power applied to the primary current path, i.e. different load currents A are applied to the active and neutral input terminals 12a, 12b of the electricity meter 2. By applying the various load conditions, a range of respective relay contact resistances of the supply disconnect switch 16 is measured and/or derived therefrom.

In a sixth design step DS6, impedance of the primary current path running through the electricity meter 2 from the active input terminal 12a to the active output terminal 12c thereof is measured after each switching operation of the supply disconnect switch 16 carried out in the fifth design step DS5.

The first design step DS1 to the sixth design step DS6 as described above are then repeated.

In a seventh design step DS7, the electrical lines 9 are disconnected and reattached to the electrical terminals 12 numerous times using different wire diameters for the electrical lines 9.

In an eighth design step DS8, impedance of the primary current path running through the electricity meter 2 from the active input terminal 12a to the active output terminal 12c thereof is measured after each change of the electrical lines 9 carried out in the seventh design step DS7.

In a ninth design step DS8, impedance of the primary current path running through the electricity meter 2 from the neutral input terminal 12b to the neutral output terminal 12d thereof is measured after each change of the electrical lines 9 carried out in the seventh design step DS7 and/or after each switching operation of the supply disconnect switch 16 carried out in the fifth design step DS5.

The first design step DS1 to the ninth design step DS9 as described above are then repeated.

In a tenth design step DS10, the temperature of the controlled temperature chamber representing the ambient temperature T100 is altered.

The first design step DS1 to the tenth design step DS10 as described above are then repeated.

In an eleventh design step DS11, different external heat sources 170, such as direct radiation from light and/or heat sources for simulating solar radiation, and/or controlled air flows are applied to the electricity meter 2, in particular to the enclosure 10 thereof. Furthermore, the type of material of the mounting structure 150 to which the electricity meter 2 is attached and/or a certain location of the electricity meter 2 in an electrical closet and/or at an electrical switchboard, are or is, respectively, altered.

The first design step DS1 to the eleventh design step DS11 as described above are then repeated.

In a twelfth design step DS12, a behaviour of the microelectronic components of the electricity meter 2 is a varied, in particular for varying heat transfers 216, 217, 218, 219, and 220, pertaining to the metering unit 17, processing unit 18, communications unit 19, and/or power supply unit 20, respectively. Such variations can be achieved e.g. by changing sample rates of the metering unit 17, changing processing loads, i.e. CPU loads, of the processing unit 18, and/or changing communication frequencies applied by the complications unit 19, etc.

The first design step DS1 to the eleventh design step DS12 as described above are then repeated for the electricity meter 2. Additionally, after a desired number of repetitions of the first design step DS1 to the eleventh design step DS12, these steps of the design time course thermal model discovery procedure carried out when establishing a thermal model according to the present invention for modelling a thermal behaviour of the electricity meter 2 can be carried out for multiple different electricity meters 2 of the same kind and/or of different kinds in order to provide respective model parameters and values for a range of multiple different electricity meters 2.

FIG. 11 shows an exemplary flowchart illustrating possible steps of an installation time course thermal model discovery procedure when establishing a thermal model according to the present invention for modelling a thermal behaviour of the electricity meter 2.

In a first installation step IS1 of the installation time course thermal model discovery procedure when establishing a thermal model according to the present invention, impedance of the primary current path running through the electricity meter 2 from the active input terminal 12a to the active output terminal 12c thereof is measured.

In a second installation step IS2, impedance of the primary current path running through the electricity meter 2 from the neutral input terminal 12b to the neutral output terminal 12d thereof is measured In a third installation step IS3, a type of the electrical lines 9 attached to the terminals 12 of the electricity meter 2 is specified, e.g. recorded and/or selected from a predefined list of possible types and/or diameters of the electrical lines 9 as enabled by the firmware of the electricity meter 2.

In a fourth installation step IS4, a type of installation of the electricity meter 2, i.e. the type of operating environment 100, mounting structure 150 and/or external heat sources 170, for example in an electrical closet, on a wall, an exposure to radiation sources, etc., is specified, e.g. recorded and/or selected from a predefined list of possible types of operating environments 100, mounting structures 150 and/or external heat sources 170, respectively, as enabled by the firmware of the electricity meter 2.

In a fifth installation step IS5, a current ambient temperature T100 is recorded in the electricity meter 2 as enabled by the firmware of the electricity meter 2.

In a sixth installation step IS6, a current time, date, and/or weather conditions at the installation site of the electricity meter 2 are or is, respectively, recorded in the electricity meter 2 as enabled by the firmware of the electricity meter 2.

FIG. 12 shows an exemplary diagram illustrating actual temperature curves TA, TB, and TC of three different electricity meters 2a, 2b, and 2c, respectively, to be emulated with a thermal model according to the present invention. For example, the three temperature curves TA, TB, and TC are emulated in line with a method according to the present invention by carrying out respective method steps as described above while assuming the same operational states, i.e. current load A, configuration status CON, communications status COM, CPU load CPU, thermal capacitance Cth, and thermal resistance Rth, for each of the electricity meters 2. Consequently, any differences in temperature values and temperature gradients shown in FIG. 12 should be due to different electrical resistances R of the current paths and/or different environmental conditions of the electricity meters 2a, 2b, and 2c.

Assuming that the electricity meters 2a, 2b, and 2c are of the same type and are each in an operational state, respective ranges, limits and/or thresholds which may be regarded as being acceptable for a correct operation of the electricity meters 2a, 2b, and 2c can be derived the three temperature curves TA, TB, and TC. In particular, FIG. 12 shows maximum slopes, i.e. emulated temperature gradients Gc of 4.3° C./min, 4.5° C./min, and 4.7° C./min, as well as maximum temperature rises dT of 47.1° C., 49.2° C., and 47.5° C., emulated by the model for the electricity meters 2a, 2b, and 2c, respectively, after a step change C happening approximately at a time t of 2:01.

Consequently, it may be derived from the three temperature curves, that an acceptable range of measured gradients Gm under the respective operating conditions extends from 4.3° C./min to 4.7° C./min, the latter constituting an upper range limit, both constituting thresholds, i.e. an upper threshold and a lower threshold, respectively, of a range of maximum values of emulated gradients dGc of 0.2° C./min. Correspondingly, an acceptable range of temperature rises dT under the respective operating conditions extends from 47.1° C. to 49.2° C., the later constituting an upper range limit, both constituting thresholds, i.e. an upper threshold and a lower threshold, respectively, of a range of maximum values of emulated temperature differences dT of 2.1° C. If then respective measured gradients Gm and/or temperatures T exceeded or fall below the thresholds, based on respective trigger signals S, events may be logged, actions may be taken, and/or alarms may be generated by the electricity meters 2a to 2c and/or a respective administration device 3.

In the alternative, it may be assumed by way of example that that the three temperature curves TA, TB, and TC illustrated in FIG. 12 pertain to one and the same electricity meter 2 with the same configuration status CON, communications status COM, CPU load CPU, thermal capacitance Cth, and supposedly thermal resistance Rth. For example, temperature curve TA is based on temperature measurements carried out by utilising at least one of the temperature sensors 21 after a certain load current A has been applied to the primary path of the electricity meter 2 at the step change C. Temperature curve TB could be an emulated temperature curve computed for an alternative load current A, which is higher than the load current underlying temperature curve TA. Temperature curve TC could be an emulated temperature curve computed for the same load current A underlying temperature curve TA.

Under these alternative assumptions, it becomes evident, that based on thresholds derived from a range of temperature gradients and temperature values between the two emulated temperature curves TB and TC alone, a faulty functional state or any hint thereto could not be detected because the measured maximum temperature gradient Gm of 4.5° C./min in temperature curve TB lies well within the two emulated maximum temperature gradients Gc of 4.3° C./min and 4.7° C./min in temperature curves TA and TC, respectively. Also, the maximum measured temperature rise dT of 47.5° C. at a time t of 4:20 in temperature curve A lies well within the two emulated temperature rises 47.1° C. and 49.2° C. at that point of time in the two emulated temperature curves TA and TC, respectively.

However, taking into account that under the alternative assumptions, temperature curve TA has been measured with the same current load A as underlying the emulated temperature curve TC, then the higher measured temperature rise dT of 47.5° C. in temperature curve TA at the time of 4:20 exceeding the emulated temperature rise dT of 47.1° C. at that point of time in temperature curve TC by a relative temperature difference ΔT of 0.4° C. between the two temperature curves at that point of time could hint to a faulty state or could at least indicate a tendency towards the development of a faulty state. Moreover, if a maximum relative temperature difference ΔT of approx. 4° C. between temperature curves TA and TC at the point of time t around 3:47 is taken into account, where the measured temperature T almost reaches the temperature in temperature curve TB emulated under assuming are higher current load A than that underlying temperature curve TA, then the deviations between temperature curves TA and TC under the alternative assumptions clearly indicate that certain parameters of the electricity meter 2 are out of range. It would then have to be assessed by applying method steps as laid down above, whether the deviations are based on modelling errors, whether the deviations are based on differences in ambient conditions, or whether indeed, the excessive heat rise in temperature curve TA indicates an increase in electrical resistance R of the primary current path of the electricity meter and/or microelectronic components, which may be due to a deterioration of electrical connections within the primary current path and/or the microelectronic components, respectively, and could therefore constitute a faulty state of the electricity meter 2.

Deviations from the above-described embodiments are possible within the scope of the present invention.

The electricity metering system 1 may comprise electricity meters 2, 2a, 2b, 2c, administration devices 3, computer programs 4, computer-readable data carriers 5, data carrier signal 6, energy and/or information transmission lines 7, transmission means 8, and/or electrical lines 9, 9a, 9b, 9c, 9d in any number and form required for implementing a desired configuration for operating, monitoring and/or controlling the electricity metering system 1 and in particular any electricity meters 2, 2a, 2b, 2c therein.

The electricity meter 2 may be provided with an enclosure 10 having wall sections 10a, 10b, 10c, 10d, terminal covers 10e, bottom sections 11, electrical terminals 12, 12a, 12b, 12c, 12d, terminal blocks 13, fixing element 13a, bus bars 14 with sections 14a, 14b, 14c, 14d, resistive shunts 15, supply disconnect switches 16, switch input lines 16a, switch output line 16b, metering unit 17, metering input lines 17a, metering output lines 17b, processing unit 18, communications units 19, power supply units 20, temperature sensors 21, 21a to 21q, internal conductors 22, substrates 23, mounting elements 24, and/or inner spaces 25 in any number and form required for performing desired functions.

Hence, the present invention is not limited to electricity meters 2 with electrical terminals 12, 12a, 12b, 12c, 12d as described herein, but can also applied to e.g. so-called socket meters having contact elements or terminals embodied as blades that slot into a socket that is part of a base assembly affixed to the wall or distribution board, which allows a fast replacement of such socket meters and avoids cabling adjustments. In such a setup, the present invention can be implemented within the socket meter, the base assembly including the socket, or a combination thereof. Socket meters may suffer from high resistance contacts on the blades and/or sockets interfacing the socket meter. For any parts or elements associated to the interfacing, analogous issues with regard to contact resistances and heat generation may arise as described herein with reference to the electrical lines 9, 9a, 9b, 9c, 9d, electrical terminals 12, 12a, 12b, 12c, 12d, respective fixing elements 13, such as contact springs, and the connections therebetween.

The administration device 3, transmission means 8, metering unit 17, processing unit 18, communication unit 19, power supply units 20 and/or temperature sensors 21, 21a to 21q may comprise any kind of electronic data processing, storage, interface and/or operation means in any number and form desired. The energy and/or information transmission lines 7, transmission means 8 and/or internal conductors 22 can be embodied as any kind of wired and/or wireless means for transferring energy, in particular electrical energy, and/or information, such as analogue and/or digital data, including any kind of computer software programs, interfaces, modules and/or functions, as well as communication systems, such as e.g. the Global System for Mobile Communications (GSM), DLMS/COSEM, Power-line communication (PLC), and alike.

The functions performed by the elements, units and modules of the metering system 1 may be implemented as hardware and/or software in order to be carried out by a single entity and/or multiple entities within the electricity meter 2 and/or the administration device 3. The electricity meter 2 and/or administration device 3 may therefore comprise at least one computer, (micro)processor or other type of processor, and at least one computer-readable medium, such as the computer readable data carrier 5, which may be embodied as any kind of internal and/or external RAM and/or ROM memory device or data storage as well as corresponding permanent or non-permanent computer and/or machine-readable media, including but not limited to e.g. cloud storage devices, microchips, flash drives, EEPROM, magnetic disks, cards, tapes, and drums, punched cards and paper tapes, optical discs, barcodes, smart codes, and/or magnetic ink characters, that stores computer-readable program code (e.g., software or firmware), such as the computer program 4, executable by the (micro)processor, logic gates, switches, interfaces, gateways, transceivers, an application specific integrated circuit (ASIC), a programmable logic controller, and/or an embedded microcontroller, for example. In particular, the electricity meter 2 and/or the administration device 3 may be configured to perform any kind of measurement, computation, calculation, processing, generation, determination, decision, monitoring and/or control step as described herein.

The at least one thermal model according to the present invention may comprise simplified thermal models and/or sophisticated thermal models as required for modelling thermal performance of the electricity meter 2 and/or of elements, parts and/or components thereof, as well as of the operating environment 100 with respective mounting structures 150, air mass 160, and/or external heat sources 170. According to the required degree of sophisticatedness of the thermal model, the envelope boundary 200 and respective heat transfers 209, 210, 210d, 214, 216, 217, 218, 219, 220, 260, 270 may be considered for any of the elements, parts, and/or components of the electricity meter 2. For modelling the thermal behaviour, any kind of thermal performance plots with respective phases, step changes, steady states, periods of time, as well as temperature values, gradients, and temperature curves with respective temperature increases and/or temperature decreases may be used, while any combination of the temperature curves may constitute a set of temperature curves.

Accordingly, a method according to the present invention may comprise steps S1 to S14, design steps DS1 to DS12, installation steps IS1 to IS6, and/or runtime steps RS1 to RS17 as required and in any number and form desired to model thermal behaviour of the electricity meter 2, 2a, 2b, 2c as well as of the operating environment 100 in order to monitor a functional state of the electricity meter 2.

Besides electricity meters 2 as described herein, a method according to the present invention as well as corresponding systems 1 comprising administration devices 3, computer programs 4, computer readable data carriers 5, data carrier signal is 6, energy and/or information transmission lines 7, transmission means 8, and/or electrical lines 9 may be used to monitor a functional state of any kind of electrical appliances, apparatuses, and/or devices, such as household devices, computers, transformers, generators, motors, or alike, in particular devices with a relatively large power input, throughput and/or output. Respective electrical appliances, apparatuses, and/or devices themselves and/or respective administration devices may be configured to carry out a method according to the present invention.

| Reference Signs | |
|---|---|
| 1 | electricity metering system |
| 2 | electricity meter |
| 2a | electricity meter A |
| 2b | electricity meter B |
| 2c | electricity meter C |
| 3 | administration device |
| 4 | computer program |
| 5 | computer-readable data carrier |
| 6 | data carrier signal |
| 7 | energy and/or information transmission line |
| 8 | transmission means |
| 9 | electrical line |
| 9a | phase input line |

-continued

| | Reference Signs | |
|---|---|---|
| 9b | neutral input line | |
| 9c | phase output line | |
| 9d | neutral output line | |
| 10 | enclosure | |
| 10a | top wall section | |
| 10b | bottom wall section | |
| 10c | front wall section | |
| 10d | back wall section | |
| 10e | terminal cover | |
| 11 | bottom section | |
| 12 | electrical terminal | |
| 12a | active input terminal | |
| 12b | neutral input terminal | |
| 12c | active output terminal | |
| 12d | neutral output terminal | |
| 13 | terminal block | |
| 13a | fixing element | |
| 14 | bus bar/primary current path | |
| 14a | active input section | |
| 14b | active linking section | |
| 14c | active output section | |
| 14d | neutral linking section | |
| 15 | resistive shunt | |
| 16 | supply disconnect switch | |
| 16a | switch input line | |
| 16b | switch output line | |
| 17 | metering unit | |
| 17a | metering input line | |
| 17b | metering output line | |
| 18 | processing unit | |
| 19 | communications unit | |
| 20 | power supply unit | |
| 21 | temperature sensor | |
| 21a | remote sensor | |
| 21b | external sensor | |
| 21c | internal top sensor | |
| 21d | internal front sensor | |
| 21e | internal back sensor | |
| 21f | internal side sensor | |
| 21g | terminal region sensor | |
| 21h | terminal block sensor | |
| 21i | supply line sensor | |
| 21j | input section sensor | |
| 21k | output section sensor | |
| 21l | linking section sensor | |
| 21m | switch sensor | |
| 21n | metering unit sensor | |
| 21o | processing unit sensor | |
| 21p | communications unit sensor | |
| 21q | supply unit sensor | |
| 22 | internal conductor | |
| 23 | substrate | |
| 24 | mounting element | |
| 25 | inner space | |
| 100 | operating environment | |
| 150 | mounting structure | |
| 160 | air mass | |
| 170 | external heat source | |
| 200 | envelope boundary | |
| 209 | heat transfer | |
| 210 | heat transfer | |
| 210d | heat transfer | |
| 214 | heat transfer | |
| 216 | heat transfer | |
| 217 | heat transfer | |
| 218 | heat transfer | |
| 219 | heat transfer | |
| 220 | heat transfer | |
| 260 | heat transfer | |
| 270 | heat transfer | |
| 300 | thermal performance plot | |
| 301 | first phase | |
| 302 | second phase | |
| 303 | third phase | |
| 400 | thermal performance plot | |
| 401 | first phase | |
| 402 | second phase | |

-continued

| | Reference Signs | |
|---|---|---|
| 403 | third phase |
| 500 | thermal performance plot |
| 501 | first phase |
| 502 | second phase |
| 503 | third phase |
| 610 | thermal performance plot |
| 611 | first phase |
| 612 | second phase |
| 613 | third phase |
| 620 | thermal performance plot |
| 621 | first phase |
| 622 | second phase |
| 623 | third phase |
| 630 | thermal performance plot |
| 631 | first phase |
| 632 | second phase |
| 633 | third phase |
| d302 | period of time |
| d412 | period of time |
| d422 | period of time |
| d432 | period of time |
| d413 | period of time |
| d423 | period of time |
| d433 | period of time |
| d512 | period of time |
| d522 | period of time |
| d532 | period of time |
| d513 | period of time |
| d523 | period of time |
| d533 | period of time |
| d612 | period of time |
| d622 | period of time |
| d632 | period of time |
| d613 | period of time |
| d623 | period of time |
| d633 | period of time |
| d712 | period of time |
| d722 | period of time |
| d732 | period of time |
| d713 | period of time |
| d723 | period of time |
| d733 | period of time |
| C301 | first step change |
| C302 | second step change |
| C401 | first step change |
| C402 | second step change |
| C501 | first step change |
| C502 | second step change |
| C611 | first step change |
| C612 | second step change |
| C621 | first step change |
| C622 | second step change |
| C631 | first step change |
| C632 | second step change |
| Q302 | first steady-state/equilibrium |
| Q303 | second steady-state/equilibrium |
| Q412 | first steady-state/equilibrium |
| Q422 | first steady-state/equilibrium |
| Q432 | first steady-state/equilibrium |
| Q413 | second steady-state/equilibrium |
| Q423 | second steady-state/equilibrium |
| Q433 | second steady-state/equilibrium |
| Q512 | first steady-state/equilibrium |
| Q522 | first steady-state/equilibrium |
| Q532 | first steady-state/equilibrium |
| Q513 | second steady-state/equilibrium |
| Q523 | second steady-state/equilibrium |
| Q533 | second steady-state/equilibrium |
| Q612 | first steady-state/equilibrium |
| Q622 | first steady-state/equilibrium |
| Q632 | first steady-state/equilibrium |
| Q613 | second steady-state/equilibrium |
| Q623 | second steady-state/equilibrium |
| Q633 | second steady-state/equilibrium |
| Q712 | first steady-state/equilibrium |
| Q722 | first steady-state/equilibrium |
| Q732 | first steady-state/equilibrium |

| Reference Signs | |
|---|---|
| Q713 | second steady-state/equilibrium |
| Q723 | second steady-state/equilibrium |
| Q733 | second steady-state/equilibrium |
| T25 | inner temperature |
| T100 | ambient temperature |
| T300 | temperature curve |
| T301 | slow temperature increase |
| T302 | rapid temperature increase |
| T303 | rapid temperature decrease |
| T410 | temperature curve |
| T411 | slow temperature increase |
| T412 | rapid temperature increase |
| T413 | rapid temperature decrease |
| T420 | temperature curve |
| T421 | slow temperature increase |
| T422 | rapid temperature increase |
| T423 | rapid temperature decrease |
| T430 | temperature curve |
| T431 | slow temperature increase |
| T432 | rapid temperature increase |
| T433 | rapid temperature decrease |
| T510 | temperature curve |
| T511 | slow temperature increase |
| T512 | rapid temperature increase |
| T513 | rapid temperature decrease |
| T520 | temperature curve |
| T521 | slow temperature increase |
| T522 | rapid temperature increase |
| T523 | rapid temperature decrease |
| T530 | temperature curve |
| T531 | slow temperature increase |
| T532 | rapid temperature increase |
| T533 | rapid temperature decrease |
| T610 | temperature curve |
| T611 | slow temperature increase |
| T612 | rapid temperature increase |
| T613 | rapid temperature decrease |
| T620 | temperature curve |
| T621 | slow temperature increase |
| T622 | rapid temperature increase |
| T623 | rapid temperature decrease |
| T630 | temperature curve |
| T631 | slow temperature increase |
| T632 | rapid temperature increase |
| T633 | rapid temperature decrease |
| T710 | temperature curve |
| T711 | slow temperature increase |
| T712 | rapid temperature increase |
| T713 | rapid temperature decrease |
| T720 | temperature curve |
| T721 | slow temperature increase |
| T722 | rapid temperature increase |
| T723 | rapid temperature decrease |
| T730 | temperature curve |
| T731 | slow temperature increase |
| T732 | rapid temperature increase |
| T733 | rapid temperature decrease |
| DS1 | first design step |
| DS2 | second design step |
| DS3 | third design step |
| DS4 | fourth design step |
| DS5 | fifth design step |
| DS6 | sixth design step |
| DS7 | seventh design step |
| DS8 | eighth design step |
| DS9 | ninth design step |
| DS10 | tenth design step |
| DS11 | eleventh design step |
| DS12 | twelfth design step |
| IS1 | first installation step |
| IS2 | second installation step |
| IS3 | third installation step |
| IS4 | fourth installation step |
| IS5 | fifth installation step |
| IS6 | sixth installation step |
| RS1 | first runtime step |
| RS2 | second runtime step |
| RS3 | third runtime step |
| RS4 | fourth runtime step |
| RS5 | fifth runtime step |
| RS6 | sixth runtime step |
| RS7 | seventh runtime step |
| RS8 | eighth runtime step |
| RS9 | ninth runtime step |
| RS10 | tenth runtime step |
| RS11 | eleventh runtime step |
| RS12 | twelfth runtime step |
| RS13 | thirteenth runtime step |
| RS14 | fourteenth runtime step |
| RS15 | fifteenth runtime step |
| RS16 | sixteenth runtime step |
| RS17 | seventeenth runtime step |
| S1 | first step |
| S1a | first substeb |
| S1b | second substep |
| S2 | second step |
| S3 | third step |
| S4 | fourth step |
| S5 | fifth step |
| S6 | sixth step |
| S7 | seventh step |
| S8 | eights step |
| S9 | ninth step |
| S10 | tenth step |
| S11 | eleventh step |
| S12 | twelfth |
| S13 | thirteenth step |
| S14 | fourteenth step |
| A | current load |
| C | step change |
| CON | configuration status |
| COM | communications status |
| CPU | CPU load |
| Cth | thermal capacitance |
| dT | temperature difference/range |
| dt | time difference |
| dG | gradient difference/range |
| G | gradient |
| Gc | computed/emulated gradient |
| Gm | measured gradient |
| L | limit/threshold |
| Q | heat transfer/heat flux |
| R | electrical resistance |
| Rth | thermal resistance |
| S | triggering signal |
| T | temperature |
| t | time |
| TA | temperature curve meter A |
| TB | temperature curve meter B |
| TC | temperature curve meter A |
| ΔT | relative temperature difference |

The invention claimed is:

1. A method of monitoring a functional state of an electricity meter, comprising the steps of:
generating at least one temperature signal from which an actual temperature value of the electricity meter can be derived; and
determining whether the actual temperature value and/or a gradient thereof exceeds at least one threshold value, wherein the at least one threshold value is being derived from at least one predefined temperature curve representing predefined temperature values of the electricity meter over time according to a modelled thermal behaviour of the electricity meter, wherein the at least one predefined temperature curve is readjusted over time, thereby providing moving or rolling thresholds or limits for respective temperature values and/or gradients.

2. The method according to claim 1, wherein the method further comprises the step of generating a triggering signal if the actual temperature value and/or a gradient thereof exceeds the at least one threshold value.

3. The method according to claim 1, wherein the method further comprises the step of adjusting the at least one predefined temperature curve and/or to select the at least one predefined temperature curve from a set of predefined temperature curves according to a certain operational state and/or according to a certain operational condition of the electricity meter.

4. The method according to claim 1, wherein the method further comprises the step of identifying at least one point of interest in the at least one predefined temperature curve, the at least one point of interest relating to certain operational conditions of the electricity meter.

5. The method according to claim 1, wherein an electrical resistance in a primary current path within the electricity meter is associated to the at least one predefined temperature curve and/or derived from the actual temperature value and/or gradient thereof.

6. The method according to claim 1 wherein the method further comprises the step of establishing at least one thermal model for modelling thermal behaviour of the electricity meter, the at least one thermal model comprising the at least one predefined temperature curve.

7. The method according to claim 6, wherein upon identification of certain errors, trends, patterns or correlations between the actual temperature value and/or the gradient thereof, and the at least one predefined temperature curve, at least one parameter of the thermal model is automatically adjusted by machine learning.

8. The method according to claim 6, wherein the step of establishing the at least one thermal model includes the step of defining at least one equilibrium state which the electricity meter assumes during operation, the at least one equilibrium state representing a thermal equilibrium of the electricity meter in dependence of at least one electrical load running through the electricity meter, and of environmental conditions existing in an environment of the electricity meter.

9. The method according to claim 6, wherein the step of establishing the at least one thermal model includes the step of defining at least one heating behaviour and/or at least one cooling behaviour of the electricity meter based on at least one functional step response of the electricity meter to a change in a functional state and/or operational state of the electricity meter.

10. The method according to claim 6, wherein the step of establishing the thermal model involves the step of determining at least one thermal resistance value and/or the step of determining at least one thermal capacitance value of the electricity meter.

11. The method according to claim 6, wherein the step of establishing at least one thermal model is carried out for at least two different types of operating conditions of the electricity meter and/or at least two different types of electricity meters.

12. A computer program for monitoring a functional state of an electricity meter, comprising instructions which, when the computer program is executed by an electricity meter and/or an administration device in an electricity metering system, cause the electricity meter and/or the administration device to carry out the steps of a method according to claim 1.

13. A computer-readable data carrier having stored thereon the computer program of claim 12.

14. A data carrier signal carrying the computer program of claim 12.

15. An electricity meter configured to carry out the method of claim 1.

16. An electricity metering system, in particular an Advanced Metering Infrastructure (AMI), comprising at least one electricity meter according to claim 15.

17. An electricity metering system, in particular an Advanced Metering Infrastructure-(AMI), comprising at least one administration device configured to carry out the method of claim 1.

* * * * *